United States Patent
Snelgrove

(10) Patent No.: US 11,342,944 B2
(45) Date of Patent: May 24, 2022

(54) COMPUTATIONAL MEMORY WITH ZERO DISABLE AND ERROR DETECTION

(71) Applicant: UNTETHER AI CORPORATION, Toronto (CA)

(72) Inventor: William Martin Snelgrove, Toronto (CA)

(73) Assignee: UNTETHER AI CORPORATION, Toronto (CA)

( * ) Notice: Subject to any disclaimer, the term of this patent is extended or adjusted under 35 U.S.C. 154(b) by 0 days.

(21) Appl. No.: 17/029,652

(22) Filed: Sep. 23, 2020

(65) Prior Publication Data

US 2021/0091794 A1 Mar. 25, 2021

Related U.S. Application Data

(60) Provisional application No. 62/904,142, filed on Sep. 23, 2019, provisional application No. 62/929,233, (Continued)

(51) Int. Cl.
*H03M 13/00* (2006.01)
*H03M 13/15* (2006.01)
(Continued)

(52) U.S. Cl.
CPC ............ *H03M 13/616* (2013.01); *G06F 7/57* (2013.01); *G06F 13/4009* (2013.01); *H03M 13/157* (2013.01)

(58) Field of Classification Search
None
See application file for complete search history.

(56) References Cited

U.S. PATENT DOCUMENTS

| 4,809,347 A | 2/1989 | Nash et al. |
| 5,038,386 A | 8/1991 | Li |

(Continued)

FOREIGN PATENT DOCUMENTS

WO WO-2014007845 A1 1/2014

OTHER PUBLICATIONS

Beivide, Ramon, et al. "Optimized mesh-connected networks for SIMD and MIMD architectures." Proceedings of the 14th annual international symposium on Computer architecture. 1987.
(Continued)

*Primary Examiner* — Phung M Chung
(74) *Attorney, Agent, or Firm* — Perry + Currier Inc.

(57) ABSTRACT

A processing element includes an input zero detector to detect whether the input from the neighbor processing element contains a zero. When the input from the neighbor processing element contains the zero, a zero disable circuit controls the input from the neighbor processing element and respective data of the memory to both appear as unchanged to the arithmetic logic unit for the operation. A controller of an array of processing elements adds a row of error-checking values to a matrix of coefficients, each error-checking value of the row of error-checking values being a negative sum of a respective column of the matrix of coefficients. The controller controls a processing element to perform an operation with the matrix of coefficients and an input vector to accumulate a result vector. Owing to the error-checking values, when a sum of elements of the result vector is non-zero, an error is detected.

4 Claims, 27 Drawing Sheets

Related U.S. Application Data filed on Nov. 1, 2019, provisional application No. 62/983,076, filed on Feb. 28, 2020.

(51) Int. Cl.
    *G06F 13/40*      (2006.01)
    *G06F 7/57*      (2006.01)

(56) References Cited

U.S. PATENT DOCUMENTS

| | | | |
|---|---|---|---|
| 5,345,408 A * | 9/1994 | Hoogenboom | G06F 17/147 |
| | | | 708/402 |
| 5,537,562 A | 7/1996 | Gallup et al. | |
| 5,689,661 A | 11/1997 | Hayashi et al. | |
| 5,689,719 A | 11/1997 | Miura et al. | |
| 5,822,608 A | 10/1998 | Dieffenderfer et al. | |
| 5,903,771 A | 5/1999 | Sgro et al. | |
| 5,956,274 A | 9/1999 | Elliott et al. | |
| 6,067,609 A | 5/2000 | Meeker et al. | |
| 6,145,072 A | 11/2000 | Shams et al. | |
| 6,167,501 A | 12/2000 | Barry et al. | |
| 6,279,088 B1 | 8/2001 | Elliott et al. | |
| 6,405,185 B1 | 6/2002 | Pechanek et al. | |
| 6,560,684 B2 | 5/2003 | Elliott et al. | |
| 6,590,419 B1 | 7/2003 | Betz et al. | |
| 6,675,187 B1 | 1/2004 | Greenberger | |
| 6,681,316 B1 | 1/2004 | Clermidy et al. | |
| 6,754,684 B1 | 6/2004 | Kotlov | |
| 6,883,084 B1 | 4/2005 | Donohoe | |
| 7,155,581 B2 | 12/2006 | Elliott et al. | |
| 7,418,579 B2 | 8/2008 | Guibert et al. | |
| 8,275,820 B2 | 9/2012 | Jhang et al. | |
| 8,443,169 B2 | 5/2013 | Pechanek | |
| 8,769,216 B2 * | 7/2014 | Fossum | G06F 17/16 |
| | | | 711/154 |
| 8,812,905 B2 | 8/2014 | Sutardja et al. | |
| 10,175,839 B2 | 1/2019 | Srivastava et al. | |
| 10,331,282 B2 | 6/2019 | Srivastava et al. | |
| 10,346,944 B2 * | 7/2019 | Nurvitadhi | G06N 3/084 |
| 10,706,498 B2 * | 7/2020 | Nurvitadhi | G06N 3/084 |
| 10,936,408 B2 * | 3/2021 | Wu | G06F 11/1028 |
| 2002/0198911 A1 | 12/2002 | Blomgren et al. | |
| 2003/0179631 A1 | 9/2003 | Koob et al. | |
| 2004/0103264 A1 | 5/2004 | Fujii et al. | |
| 2004/0133750 A1 | 7/2004 | Stewart et al. | |
| 2005/0226337 A1 | 10/2005 | Dorojevets et al. | |
| 2007/0033369 A1 | 2/2007 | Kasama et al. | |
| 2012/0216012 A1 | 8/2012 | Vorbach et al. | |
| 2013/0103925 A1 | 4/2013 | Meeker | |
| 2015/0310311 A1 | 10/2015 | Shi et al. | |
| 2017/0148371 A1 | 5/2017 | Qian | |
| 2017/0206089 A1 | 7/2017 | Hosoi | |
| 2018/0157970 A1 | 6/2018 | Henry et al. | |
| 2019/0004878 A1 | 1/2019 | Adler et al. | |
| 2019/0018794 A1 | 1/2019 | Beard et al. | |
| 2019/0095776 A1 | 3/2019 | Kfir et al. | |
| 2020/0145926 A1 * | 5/2020 | Velusamy | H04W 52/0277 |
| 2020/0279349 A1 * | 9/2020 | Nurvitadhi | G06F 12/0831 |

OTHER PUBLICATIONS

Serrano, Mauricio J. et al. "Optimal architectures and algorithms for mesh-connected parallel computers with separable row/column buses." IEEE transactions on parallel and distributed systems 4.10 (1993): 1073-1080.

Svensson, B., "SIMD processor array architectures", May 16, 1990, pp. 1-44.

PCT/IB2020/052163, Computational Memory, Mar. 11, 2020.

U.S. Appl. No. 16/815,535, Computational Memory, filed Mar. 11, 2020.

PCT/IB2020/057724, Computational Memory With Processing Element Row and Bank Communications, Aug. 17, 2020.

U.S. Appl. No. 17/187,082, Computational Memory With Cooperation Among Rows of Processing Elements and Memory Thereof, filed Feb. 26, 2021.

PCT/IB2020/052163, Computational Memory, filed Mar. 11, 2020.

U.S. Appl. No. 17/675,729, Computational Memory, filed Feb. 18, 2022.

PCT/IB2020/057724, Computational Memory With Processing Element Row and Bank Communications, filed Aug. 17, 2020.

U.S. Appl. No. 17/187,082, Computational Memory With Cooperation Among Rows of Processing Elements and Memory Thereof, Feb. 26, 2021.

* cited by examiner

COMPUTATIONAL MEMORY WITH ZERO DISABLE AND ERROR DETECTION

CROSS-REFERENCE TO RELATED APPLICATIONS

This application claims priority to US provisional patent application Ser. No. 62/904,142 (filed Sep. 23, 2019), 62/929,233 (filed Nov. 1, 2019), and 62/983,076 (filed Feb. 28, 2020), all of which are incorporated herein by reference.

BACKGROUND

Deep learning has proven to be a powerful technique for performing functions that have long resisted other artificial intelligence approaches. For example, deep learning may be applied to recognition of objects in cluttered images, speech understanding and translation, medical diagnosis, gaming, and robotics. Deep learning techniques typically apply many layers (hence "deep") of neural networks that are trained (hence "learning") on the tasks of interest. Once trained, a neural network may perform "inference", that is, inferring from new input data an output consistent with what it has learned.

Neural networks, which may also be called neural nets, perform computations analogous to the operations of biological neurons, typically computing weighted sums (or dot products) and modifying the results with a memoryless nonlinearity. However, it is often the case that more general functionality, such as memory, multiplicative nonlinearities, and "pooling", are also required.

In many types of computer architecture, power consumption due to physically moving data between memory and processing elements is non-trivial and is frequently the dominant use of power. This power consumption is typically due to the energy required to charge and discharge the capacitance of wiring, which is roughly proportional to the length of the wiring and hence to distance between memory and processing elements. As such, processing a large number of computations in such architectures, as generally required for deep learning and neural networks, often requires a relatively large amount of power. In architectures that are better suited to handle deep learning and neural networks, other inefficiencies may arise, such as increased complexity, increased processing time, and larger chip area requirements.

SUMMARY

According to one aspect of this disclosure, a processing device includes an array of processing elements, each processing element including an arithmetic logic unit to perform an operation, each processing element connected to memory to store data for the operation. The processing device further includes interconnections among the array of processing elements to provide direct communication among neighboring processing elements of the array of processing elements, wherein a processing element of the array of processing elements is connected to a neighbor processing element via an input selector to selectively take output of the neighbor processing element as input to the processing element for the operation. The processing element further includes an input zero detector to detect whether the input from the neighbor processing element contains a zero, and a zero disable circuit connected to the input zero detector. When the input from the neighbor processing element contains the zero, the zero disable circuit is to control the input from the neighbor processing element and respective data of the memory to both appear as unchanged to the arithmetic logic unit for the operation.

The input zero detector may further detect whether the respective data of the memory contains a zero. The zero disable circuit may control the input from the neighbor processing element and respective data of the memory to both appear as unchanged to the arithmetic logic unit for the operation, when either or both the input from the neighbor processing element or the respective data of the memory contains the zero.

According to another aspect of this disclosure, a controller of an array of processing elements is configured to add a row of error-checking values to a matrix of coefficients, each error-checking value of the row of error-checking values being a negative sum of a respective column of the matrix of coefficients, load the matrix of coefficients into the array of processing elements as serialized coefficients, load an input vector into the array of processing elements, and control the array of processing elements to perform an operation with the matrix of coefficients and the input vector. The operation may include performing a parallel operation with the serialized coefficients in the array of processing elements and the input vector, accumulating a result vector, and rotating the input vector in the array of processing elements and repeating the performing of the parallel operation and the accumulating until the operation is complete. When the operation is complete, a sum of elements of the result vector is computed and an error in the operation is detected when the sum is non-zero.

The controller may be configured to repeat the operation using a different array of processing elements when the error is detected.

DETAILED DESCRIPTION

The techniques described herein aim to improve computational memory to handle large numbers of dot-product and neural-network computations with flexible low-precision arithmetic, provide power-efficient communications, and provide local storage and decoding of instructions and coefficients. The parallel processing described herein is suitable for neural networks, particularly where power consumption is a concern, such as in battery-powered devices, portable computers, smartphones, wearable computers, smart watches, and the like.

Figure 1:
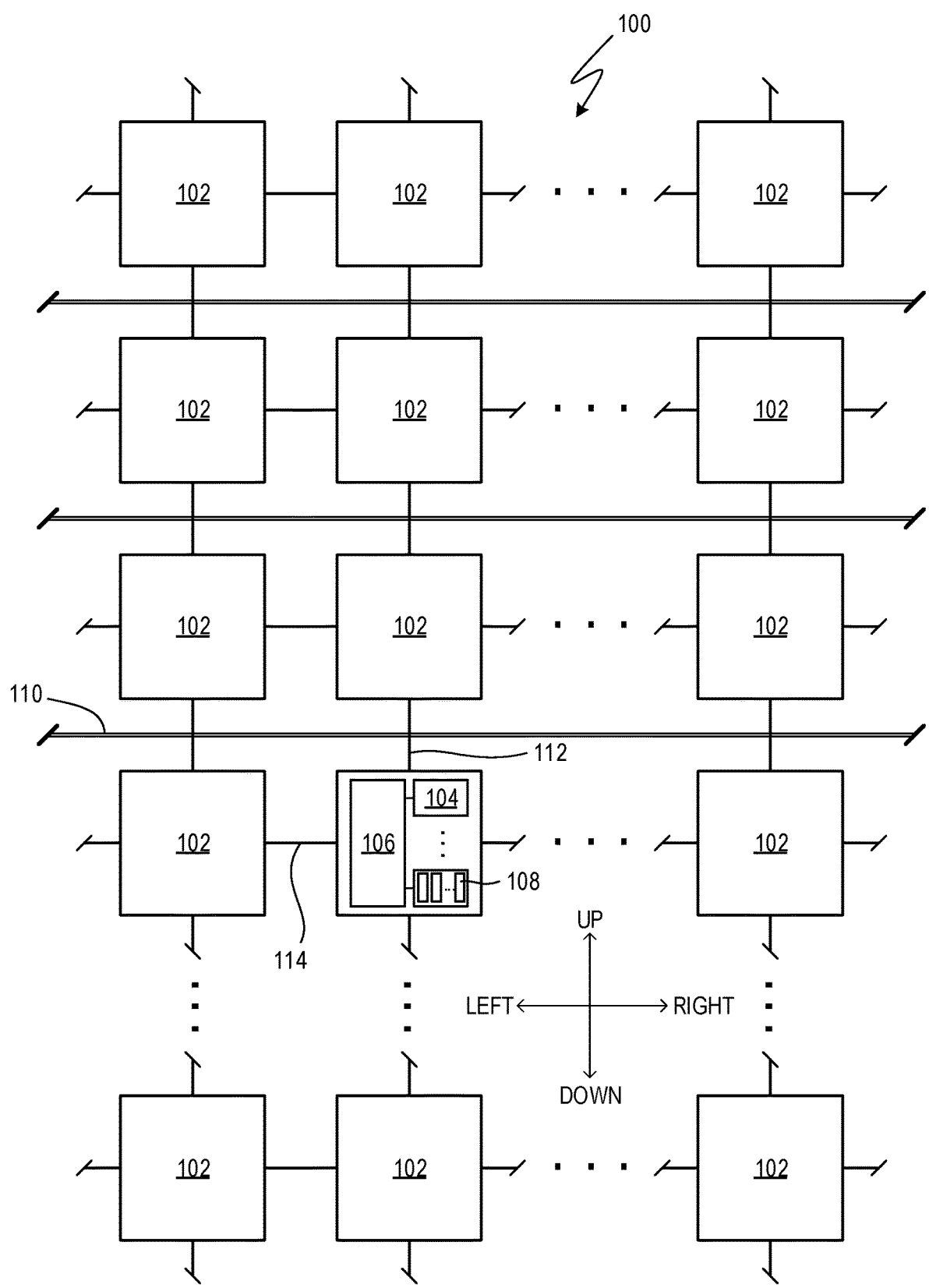
FIG. 1 is a block diagram of an example computing device that includes banks of processing elements.

FIG. 1 shows a computing device 100. The computing device 100 includes a plurality of banks 102 of processing elements. The banks 102 may be operated in a cooperative manner to implement a parallel processing scheme, such as a single instruction, multiple data (SIMD) scheme.

The banks 102 may be arranged in a regular rectangular grid-like pattern, as illustrated. For sake of explanation, relative directions mentioned herein will be referred to as up, down, vertical, left, right, horizontal, and so on. However, it is understood that such directions are approximations, are not based on any particular reference direction, and are not to be considered limiting.

Any practical number of banks 102 may be used. Limitations in semiconductor fabrication techniques may govern. In some examples, 512 banks 102 are arranged in a 32-by-16 grid.

A bank 102 may include a plurality of rows 104 of processing elements (PEs) 108 and a controller 106. A bank 102 may include any practical number of PE rows 104. For example, eight rows 104 may be provided for each controller 106. In some examples, all banks 102 may be provided with the same or similar arrangement of rows. In other examples, substantially all banks 102 are substantially identical. In still other examples, a bank 102 may be assigned a special purpose in the computing device and may have a different architecture, which may omit PE rows 104 and/or a controller 106.

Any practical number of PEs 108 may be provided to a row 104. For example, 256 PEs may be provided to each row 104. Continuing the numerical example above, 256 PEs provided to each of eight rows 104 of 512 banks 102 means the computing device 100 includes about 1.05 million PEs 108, less any losses due to imperfect semiconductor manufacturing yield.

A PE 108 may be configured to operate at any practical bit size, such as one, two, four, or eight bits. PEs may be operated in pairs to accommodate operations requiring wider bit sizes.

Instructions and/or data may be communicated to/from the banks 102 via an input/output (I/O) bus 110. The I/O bus 110 may include a plurality of segments.

A bank 102 may be connected to the I/O bus 110 by a vertical bus 112. Additionally or alternatively, a vertical bus 112 may allow communication among banks 102 in a vertical direction. Such communication may be restricted to immediately vertically adjacent banks 102 or may extend to further banks 102.

A bank 102 may be connected to a horizontally neighboring bank 102 by a horizontal bus 114 to allow communication among banks 102 in a horizontal direction. Such communication may be restricted to immediately horizontally adjacent banks 102 or may extend to further banks 102.

Communications through any or all of the busses 110, 112, 114 may include direct memory access (DMA) to memory of the rows 104 of the PEs 108. Additionally or alternatively, such communications may include memory access performed through the processing functionality of the PEs 108.

The computing device 100 may include a main processor (not shown) to communicate instructions and/or data with the banks 102 via the I/O bus 110, manage operations of the banks 102, and/or provide an I/O interface for a user, network, or other device. The I/O bus 110 may include a Peripheral Component Interconnect Express (PCIe) interface or similar.

Figure 2:
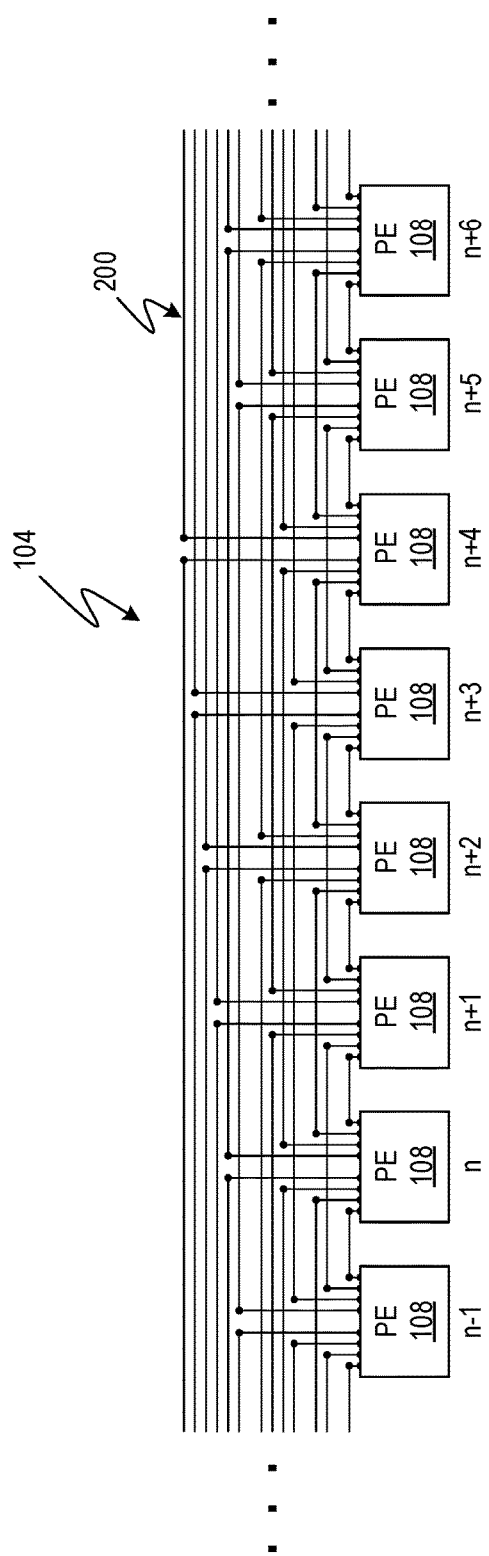
FIG. 2 is a block diagram of an example array of processing elements.

FIG. 2 shows an example row 104 including an array of processing elements 108, which may be physically arranged in a linear pattern (e.g., a physical row). Each PE 108 includes an arithmetic logic unit (ALU) to perform an operation, such as addition, multiplication, and so on.

The PEs 108 are mutually connected to share or communicate data. For example, interconnections 200 may be provided among the array of PEs 108 to provide direct communication among neighboring PEs 108.

A PE 108 (e.g., indicated at "n") is connected to a first neighbor PE 108 (i.e., n+1) that is immediately adjacent the PE 108. Likewise, the PE 108 (n) is further connected to a second neighbor PE 108 (n+2) that is immediately adjacent the first neighbor PE 108 (n+1). A plurality of PEs 108 may be connected to neighboring processing elements in the same relative manner, where n merely indicates an example PE 108 for explanatory purposes. That is, the first neighbor PE 108 (n+1) may be connected to its respective first and second neighbors (n+2 and n+3).

A given PE 108 (e.g., n+5) may also be connected to an opposite first neighbor PE 108 (n+4) that is immediately adjacent the PE 108 (n+5) on a side opposite the first neighbor PE 108 (n+6). Similarly, the PE 108 (n+5) may further be connected to an opposite second neighbor PE 108 (n+3) that is immediately adjacent the opposite first neighbor PE 108 (n+4).

Further, a PE 108 may be connected to a fourth neighbor PE 108 that is immediately adjacent a third neighbor PE 108 that is immediately adjacent the second neighbor PE 108. For example, the PE 108 designated at n may be connected to the PE designated at n+4. A connection of the PE 108 (n) to its third neighbor PE 108 (n+3) may be omitted. The fourth-neighbor connection may also be provided in the opposite direction, so that the PE 108 (n) connects to its fourth neighbor PE 108 at n−4 (not shown).

Still further, a PE 108 may be connected to a sixth neighbor PE 108 that is immediately adjacent a fifth neighbor PE 108 that is immediately adjacent the fourth neighbor PE 108. For example, the PE 108 designated at n may be connected to the PE designated at n+6. A connection of the PE 108 (n) to its fifth neighbor PE 108 (n+5) may be omitted. The sixth-neighbor connection may also be provided in the opposite direction, so that the PE 108 (n) connects to its sixth neighbor PE 108 at n−6 (not shown).

Again, a plurality of PEs 108 may be connected to neighboring processing elements in the above relative manner. The designation of a PE 108 as n may be considered arbitrary for non-endmost PEs 108. PEs 108 at the ends of the array may omit certain connections by virtue of the array terminating. In the example of each PE 108 being connected to its first, second, fourth, and sixth neighbor PEs 108 in both directions, the six endmost PEs 108 have differing connections.

Figure 3:
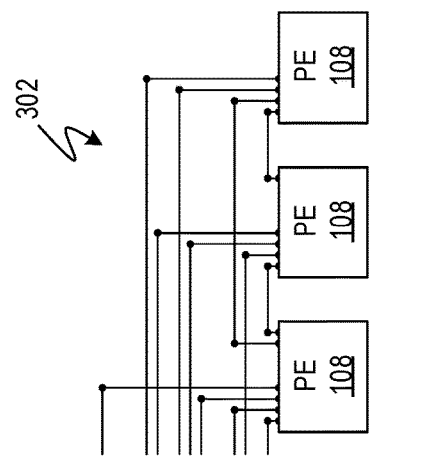
FIG. 3 is a block diagram of an example array of processing elements with a controller.
Figure 3:
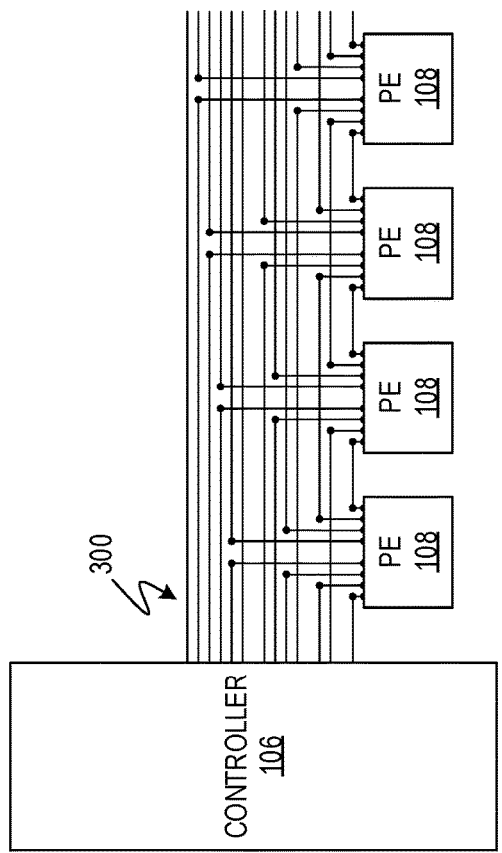

With reference to FIG. 3, endmost PEs 108 at one end of a row 104 may have connections 300 to a controller 106. Further, endmost PEs 108 at the opposite end of the row 104 may have a reduced number of connections 302. Additionally or alternatively, end-most PEs 108 of one bank 102 may connect in the same relative manner through the controller 106 and to PEs 108 of an adjacent bank 102. That is, the controller 106 may be connected between two rows 104 of PEs 108 in adjacent banks 102, where the two rows 104 of PEs 108 are connected in the same manner as shown in FIG. 2

Figure 4:
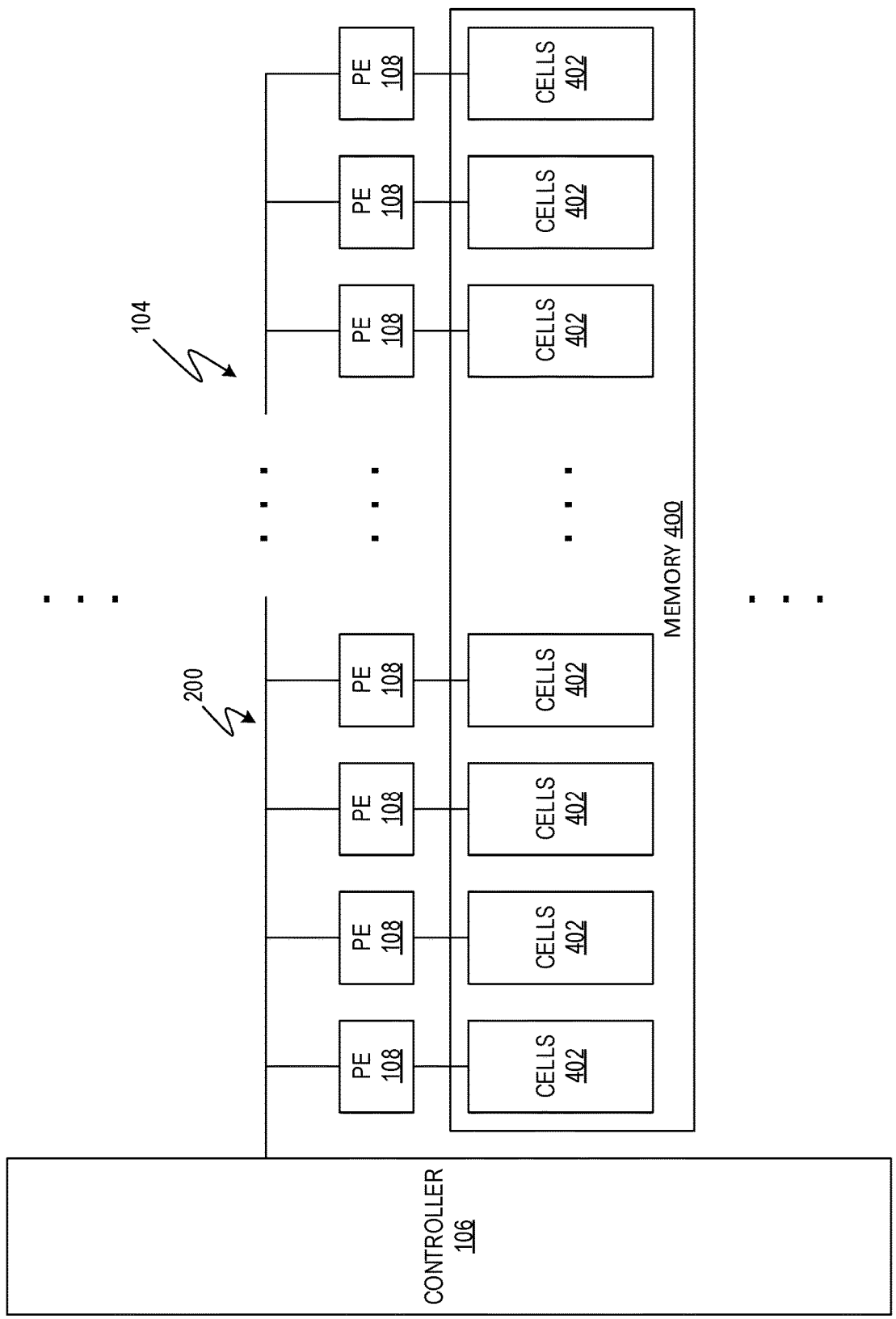
FIG. 4 is a block diagram of an example array of processing elements with a controller and memory.

With reference to FIG. 4, a row 104 of PEs 108 may include memory 400 to store data for the row 104. A PE 108 may have a dedicated space in the memory 400. For example, each PE 108 may be connected to a different range of memory cells 402. Any practical number of memory cells 402 may be used. In one example, 144 memory cells 402 are provided to each PE 108. Note that in FIG. 4 the interconnections 200 among the PEs 108 and with the controller 106 are shown schematically for sake of explanation.

The controller 106 may control the array of PEs 108 to perform a SIMD operation with data in the memory 400. For example, the controller 106 may trigger the PEs 108 to simultaneously add two numbers stored in respective cells 402.

The controller 106 may communicate data to and from the memory 400 though the PEs 108. For example, the controller 106 may load data into the memory 400 by directly loading data into connected PEs 108 and controlling PEs 108 to shift the data to PEs 108 further in the array. PEs 108 may load such data into their respective memory cells 402. For example, data destined for rightmost PEs 108 may first be loaded into leftmost PEs and then communicated rightwards by interconnections 200 before being stored in rightmost memory cells 402. Other methods of I/O with the memory, such as direct memory access by the controller 106, are also contemplated. The memory cells 402 of different PEs 108 may have the same addresses, so that address decoding may be avoided to the extent possible.

Data stored in memory cells 402 may be any suitable data, such as operands, operators, coefficients, vector components, mask data, selection data, and similar. Mask data may be used to select portions of a vector. Selection data may be used to make/break connections among neighboring PEs 108.

Further, the controller 106 may perform a rearrangement of data within the array of PEs 108 by controlling communication of data through the interconnections 200 among the array of PEs 108. A rearrangement of data may include a rotation or cycling that reduces or minimizes a number of memory accesses while increasing or maximizing operational throughput. Other examples of rearrangements of data include reversing, interleaving, and duplicating.

In other examples, a set of interconnections 200 may be provided to connect PEs 108 in up-down (column-based) connections, so that information may be shared directly between PEs 108 that are in adjacent rows. In this description, interconnections 200 and related components that are discussed with regard to left-right (row-based) connections among PEs apply in principle to up-down (column-based) connections among PEs.

Figures 5, 6:
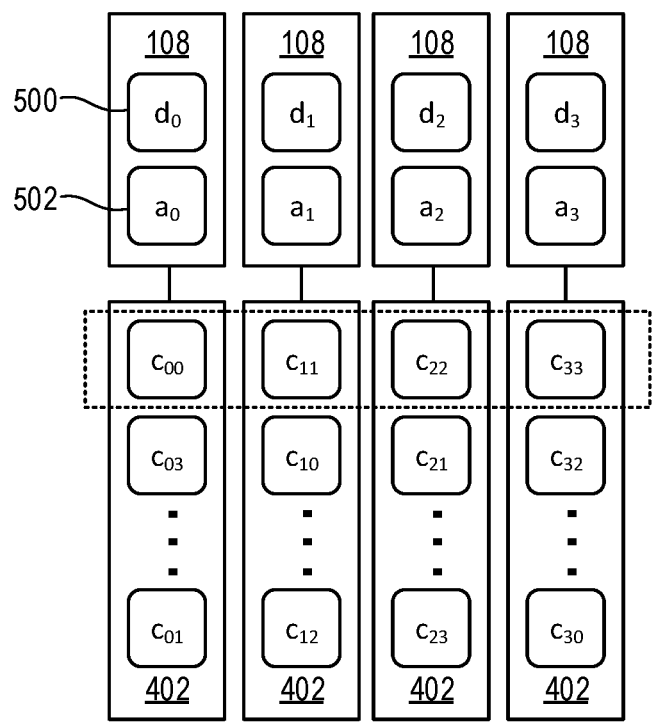
FIG. 5 is a schematic diagram of example processing elements and related memory cells.
FIG. 6 is an equation for an example matrix multiplication carried out by the processing elements and memory cells of FIG. 5.

FIG. 5 shows an array of PEs 108 and related memory cells 402. Each PE 108 may include local registers 500, 502 to hold data undergoing an operation. Memory cells 402 may also hold data contributing to the operation. For example, the PEs 108 may carry out a matrix multiplication, as shown in FIG. 6.

A matrix multiplication may be a generalized matrix-vector multiply (GEMV). A matrix multiplication may use a coefficient matrix and an input vector to obtain a resultant vector. In this example, the coefficient matrix is a four-by-four matrix and the vectors are of length four. In other examples, matrices and vectors of any practical size may be used. In other examples, a matrix multiplication may be a generalized matrix-matrix multiply (GEMM).

As matrix multiplication involves sums of products, the PEs 108 may additively accumulate resultant vector components $d_0$ to $d_3$ in respective registers 500, while input vector components $a_0$ to $a_3$ are multiplied by respective coefficients $c_{00}$ to $c_{33}$. That is, one PE 108 may accumulate a resultant vector component $d_0$, a neighbor PE 108 may accumulate another resultant vector component $d_1$, and so on. Resultant vector components $d_0$ to $d_3$ may be considered dot products. Generally, a GEMV may be considered a collection of dot products of a vector with a set of vectors represented by the rows of a matrix.

To facilitate matrix multiplication, the contents of registers 500 and/or registers 502 may be rearranged among the PEs 108. A rearrangement of resultant vector components $d_0$ to $d_3$ and/or input vector components $a_0$ to $a_3$ may use the direct interconnections among neighbor PEs 108, as discussed above. In this example, resultant vector components $d_0$ to $d_3$ remain fixed and input vector components $a_0$ to $a_3$ are moved. Further, coefficients $c_{00}$ to $c_{33}$ may be loaded into memory cells to optimize memory accesses.

In the example illustrated in FIG. 5, the input vector components $a_0$ to $a_3$ are loaded into a sequence of PEs 108 that are to accumulate resultant vector components $d_0$ to $d_3$ in the same sequence. The relevant coefficients $c_{00}$, $c_{11}$, $c_{22}$, $c_{33}$ are accessed and multiplied by the respective input vector components $a_0$ to $a_3$. That is, $a_0$ and $c_{00}$ are multiplied and then accumulated as $d_0$, $a_1$ and $c_{11}$ are multiplied and then accumulated as $d_1$, and so on.

Figure 7A:
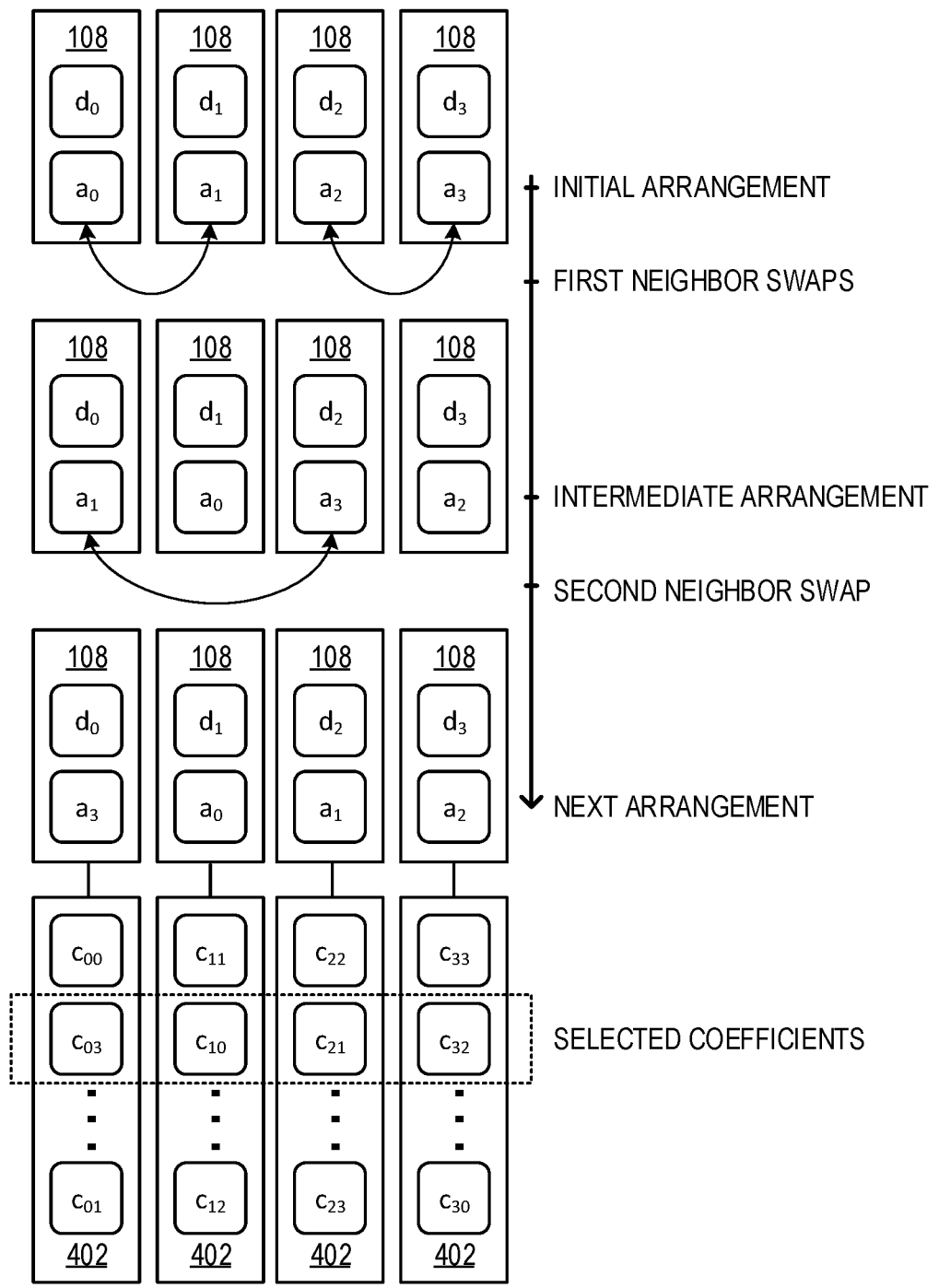
FIG. 7A is a schematic diagram of an example state sequence of the processing elements and memory cells of FIG. 5.

The input vector components $a_0$ to $a_3$ are then rearranged, as shown in the PE state sequence of FIG. 7A, so that a remaining contribution of each input vector components $a_0$ to $a_3$ to a respective resultant vector components $d_0$ to $d_3$ may be accumulated. In this example, input vector components $a_0$ to $a_2$ are moved one PE 108 to the right and input vector components $a_3$ is moved three PEs 108 to the left. With reference to the first and second neighbor connections shown in FIG. 2, this rearrangement of input vector components $a_0$ to $a_3$ may be accomplished by swapping $a_0$ with $a_1$ and simultaneously swapping $a_2$ with $a_3$, using first neighbor connections, and then by swapping $a_1$ with $a_3$ using second neighbor connections. The result is that a next arrangement of input vector components $a_3$, $a_0$, $a_1$, $a_2$ at the PEs 108 is achieved, where each input vector component is located at a PE 108 that it has not yet occupied during the present matrix multiplication.

Appropriate coefficients $c_{03}$, $c_{10}$, $c_{21}$, $c_{32}$ in memory cells 402 are then accessed and multiplied by the respective input vector components $a_3$, $a_0$, $a_1$, $a_2$. That is, $a_3$ and $c_{03}$ are multiplied and then accumulated as $d_0$, $a_0$ and $c_{10}$ are multiplied and then accumulated as $d_1$, and so on.

The input vector components $a_0$ to $a_3$ are then rearranged twice more, with multiplying accumulation being performed with the input vector components and appropriate coefficients at each new arrangement. At the conclusion of four sets of multiplying accumulation and three intervening rearrangements, the accumulated resultant vector components $d_0$ to $d_3$ represent the final result of the matrix multiplication.

Rearrangement of the input vector components $a_0$ to $a_3$ allows each input vector component to be used to the extent needed when it is located at a particular PE 108. This is different from traditional matrix multiplication where each resultant vector component is computed to finality prior to moving to the next. The present technique simultaneously accumulates all resultant vector components using sequenced arrangements of input vector components.

Further, such rearrangements of data at the PEs 108 using the PE neighbor interconnections (FIG. 2) may be optimized to reduce or minimize processing cost. The example given above of two simultaneous first neighbor swaps followed by a second neighbor swap is merely one example. Additional examples are contemplated for matrices and vectors of various dimensions.

Further, the arrangements of coefficients $c_{00}$ to $c_{33}$ in the memory cells 402 may be predetermined, so that each PE 108 may access the next coefficient needed without requiring coefficients to be moved among memory cells 402. The coefficients $c_{00}$ to $c_{33}$ may be arranged in the memory cells 402 in a diagonalized manner, such that a first row of coefficients is used for a first arrangement of input vector components, a second row of coefficients is used for a second arrangement of input vector components, and so on. Hence, the respective memory addresses referenced by the PEs 108 after a rearrangement of input vector components may be incremented or decremented identically. For example, with a first arrangement of input vector components, each PE 108 may reference its respective memory cell at address 0 for the appropriate coefficient. Likewise, with a second arrangement of input vector components, each PE 108 may reference its respective memory cell at address 1 for the appropriate coefficient, and so on.

Figure 7B:
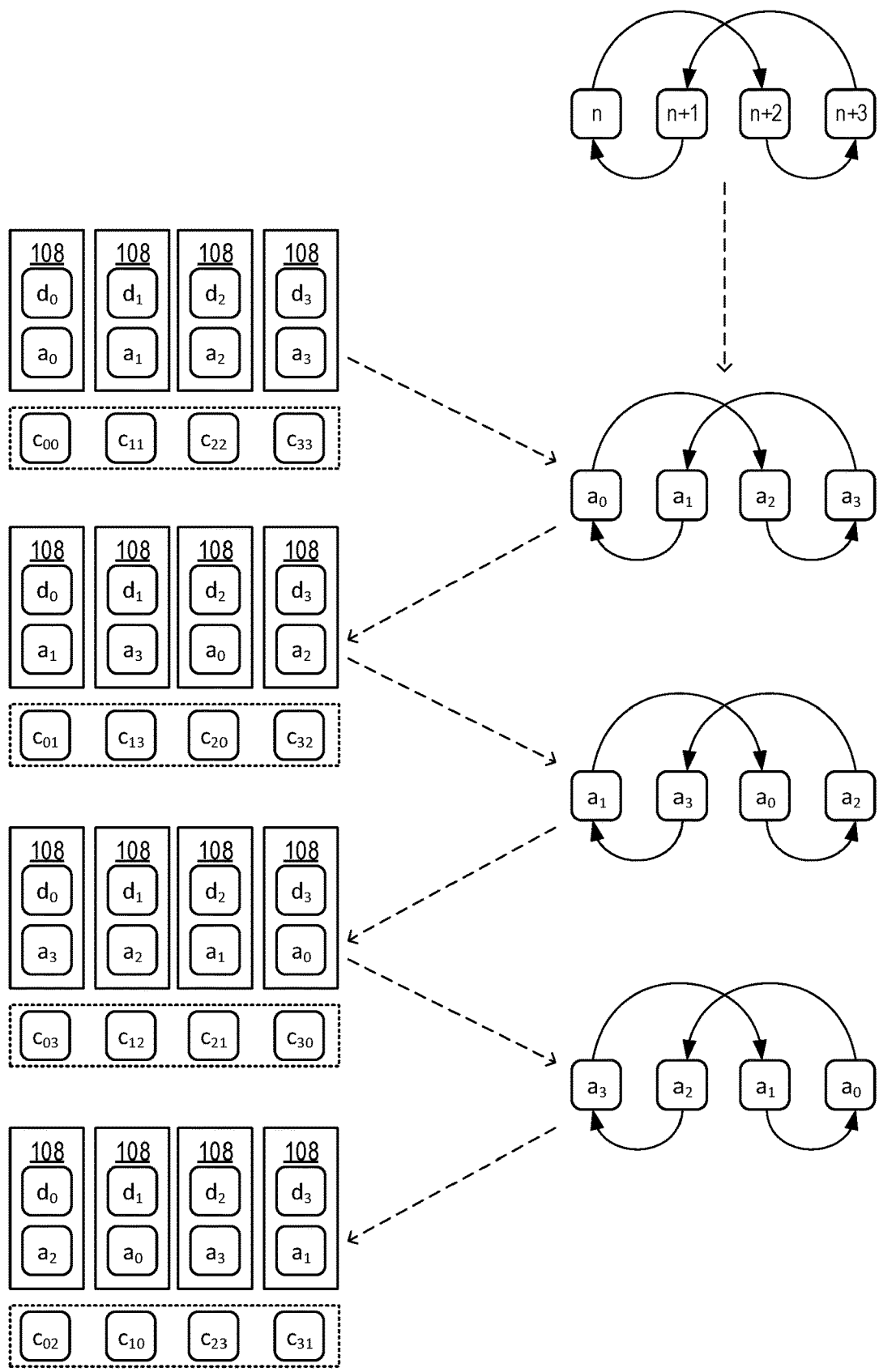
FIG. 7B is a schematic diagram of an example state sequence of the processing elements and memory cells of FIG. 5.

FIG. 7B shows another example sequence. Four states of a set of PEs 108 are shown with four sets of selected coefficients. Input vector components $a_0$ to $a_3$ are rotated so that each component $a_0$ to $a_3$ is used exactly once to contribute to the accumulation at each resultant vector component $d_0$ to $d_3$. The coefficients $c_{00}$ to $c_{33}$ are arranged so that the appropriate coefficient $c_{00}$ to $c_{33}$ is selected for each combination of input vector component $a_0$ to $a_3$ and resultant vector component $d_0$ to $d_3$. In this example, the input vector components $a_0$ to $a_3$ are subject to the same rearrangement three times to complete a full rotation. Specifically, the input vector component of an $n^{th}$ PE 108 is moved right to the second neighbor PE 108 (i.e., n+2), the input vector component of the PE 108 n+1 is moved left (opposite) to its first neighbor PE 108 (i.e., n) in that direction, the input vector component of the PE 108 n+2 is moved right to the first neighbor PE 108 (i.e., n+3), and the input vector component of the PE 108 n+3 is moved left to the second neighbor PE 108 (i.e., n+1).

Figure 7C:
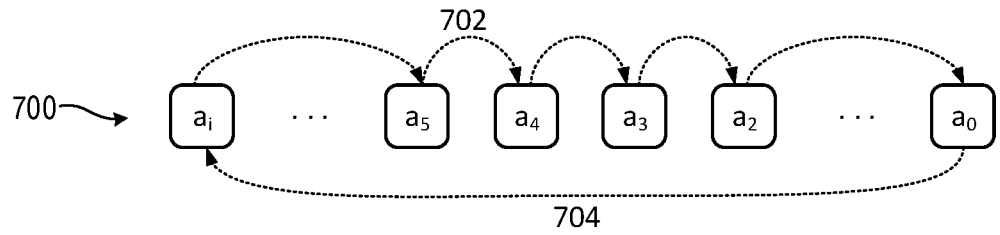
FIG. 7C is a schematic diagram of an example generalized solution to movement of input vector components among a set of processing elements.
Figure 7C:
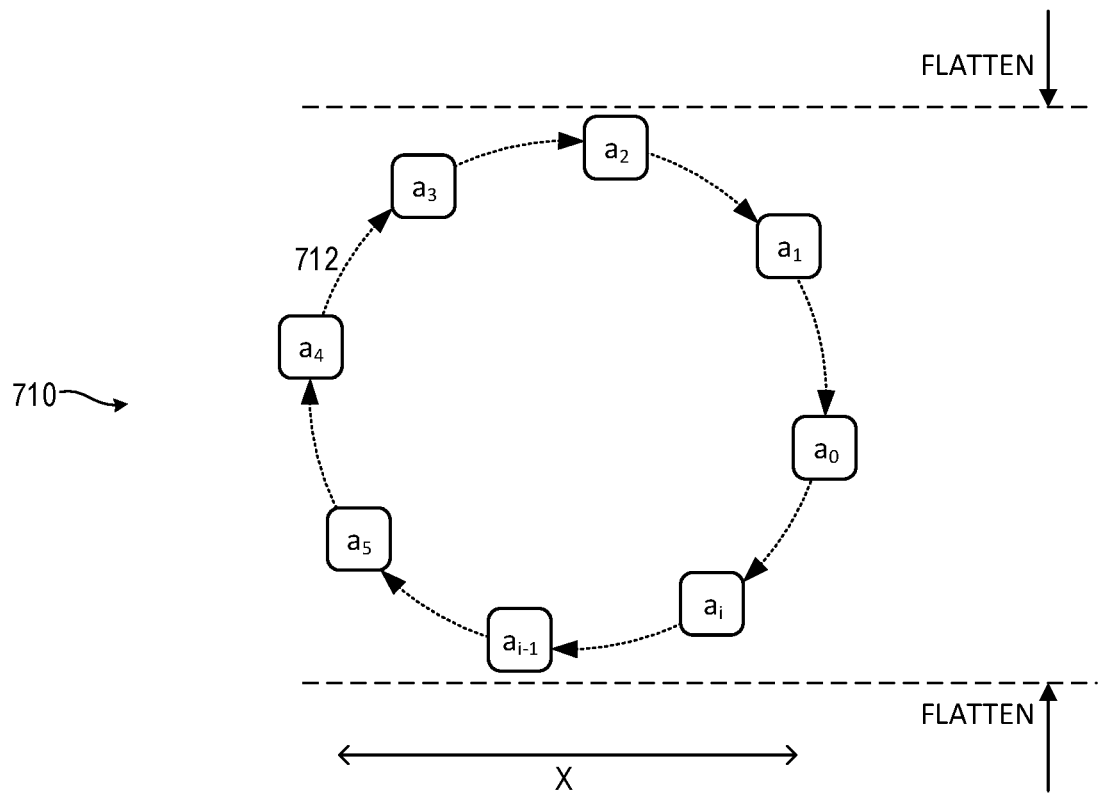
Figure 7C:
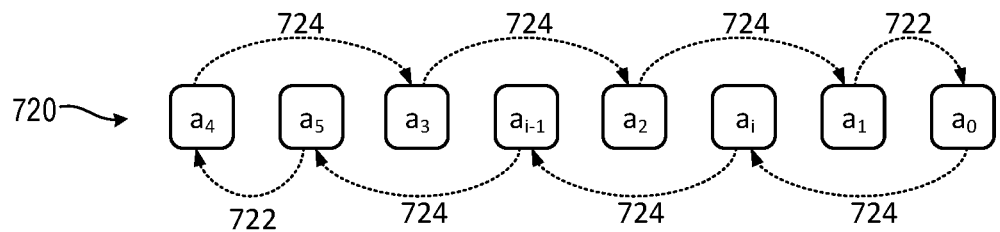

FIG. 7C shows a generalized solution, which is implicit from the examples discussed herein, to movement of input vector components among a set of PEs 108. As shown by the row-like arrangement 700 of input vector components $a_0$ to $a_i$, which may be held by a row 104 of PEs 108, rotating information may require many short paths 702, between adjacent components $a_0$ to $a_i$, and a long path 704 between end-most components $a_i$ and $a_0$. The short paths are not a concern. However, the long path 704 may increase latency and consume additional electrical power because charging and charging a conductive trace takes time and is not lossless. The longer the trace, the greater the time/loss. The efficiency of a row 104 of PEs 108 is limited by its long path 704, in that power is lost and other PEs 108 may need to wait while data is communicated over the long path 704.

As shown at 710, a circular arrangement of PEs 108 may avoid a long path 704. All paths 712 may be segments of a circle and may be made the same length. A circular arrangement 710 of PEs 108 may be considered an ideal case. However, a circular arrangement 710 is impractical for manufacturing purposes.

Accordingly, the circular arrangement 720 may be rotated slightly and flattened (or squashed), while preserving the connections afforded by circular segment paths 712 and the relative horizontal (X) positions of the PEs, to provide for an efficient arrangement 720, in which paths 722, 724 connect adjacent PEs or skip one intermediate PE. As such, PEs 108 may be connected by a set of first-neighbor paths 722 (e.g., two end-arriving paths) and a set of second neighbor paths 724 (e.g., four intermediate and two end-leaving paths) that are analogous to circular segment paths 712 of a circular arrangement 710. The paths 722, 724 have much lower variance than the short and long paths 702, 704, so power may be saved and latency reduced. Hence, the arrangement 720 represents a readily manufacturable implementation of an ideal circular arrangement of PEs 108.

Figure 8:
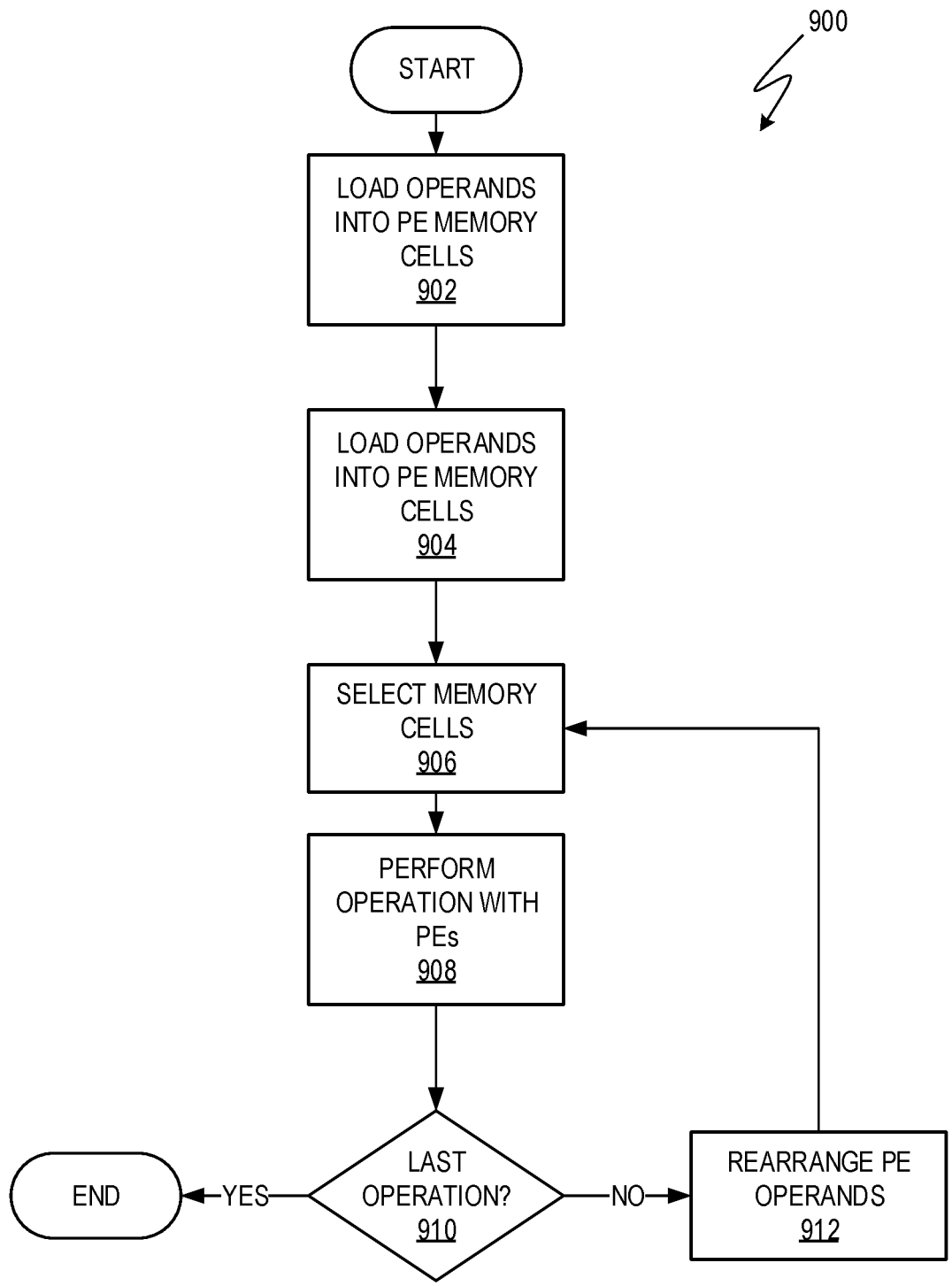
FIG. 8 is a flowchart of an example method of performing operations using processing elements and memory cells.

FIG. 8 shows a method 900 that generalizes the above example. The method 900 may be performed with the computing device 100 or a similar device. The method may be implemented by instructions executable by the device 100 or a controller 106 thereof. The instructions may be stored in a non-transitory computer-readable medium integral to the device 100 or controller 106.

At block 902, operands (e.g., matrix coefficients) are loaded into PE memory cells. The arrangement of operands may be predetermined with the constraint that moving operands is to be avoided where practical. An operand may be duplicated at several cells to avoid moving an operand between such cells.

At block 904, operands (e.g., input vector components) are loaded into PE registers. The operands to be loaded into PE registers may be distinguished from the operands to be loaded into PE memory cells, in that there may be fewer PE registers than PE memory cells. Hence, in the example of a matrix multiplication, it may be more efficient to load the smaller matrix/vector to the into PE registers and load the larger matrix into the PE memory cells. In other applications, other preferences may apply.

At block 906, a set of memory cells may be selected for use in an operation. The set may be a row of memory cells. For example, a subset of coefficients of a matrix to be multiplied may be selected, one coefficient per PE.

At block 908, the same operation is performed by the PEs on the contents of the selected memory cells and respective PE registers. The operation may be performed substantially simultaneously with all relevant PEs. All relevant PEs may be all PEs of a device or a subset of PEs assigned to perform the operation. An example operation is a multiplication (e.g., multiplying PE register content with memory cell content) and accumulation (e.g., accumulating the resulting product with a running total from a previous operation).

Then, if a subsequent operation is to be performed, via block 910, operands in the PE registers may be rearranged, at block 912, to obtain a next arrangement. A next set of memory cells is then selected at block 906, and a next operation is performed at block 908. For example, a sequence of memory cells may be selected during each cycle and operands in the PE registers may be rearranged to correspond to the sequence of memory cells, so as to perform a matrix multiplication. In other examples, other operations may be performed.

Hence, a sequence or cycle or operations may be performed on the content of selected memory cells using the content of PE registers that may be rearranged as needed. The method 900 ends after the last operation, via block 910.

The method 900 may be varied. In various examples, selection of the memory cells need not be made by selection of a contiguous row. Arranging data in the memory cells according to rows may simplify the selection process. For example, a single PE-relative memory address may be referenced (e.g., all PEs refer to their local memory cell with the same given address). That said, it is not strictly necessary to arrange the data in rows. In addition or alternatively, a new set of memory cells need not be selected for each operation. The same set may be used in two or more consecutive cycles. Further, overlapping sets may be used, in that a memory cell used in a former operation may be deselected and a previously unselected memory cell may be selected for a next operation, while another memory cell may remain selected for both operations. In addition or alternatively, the operands in the PE registers need not be rearranged each cycle. Operands may remain in the same arrangement for two or more consecutive cycles. Further, operand rearrangement does not require each operand to change location, in that a given operand may be moved while another operand may remain in place.

Figure 9:
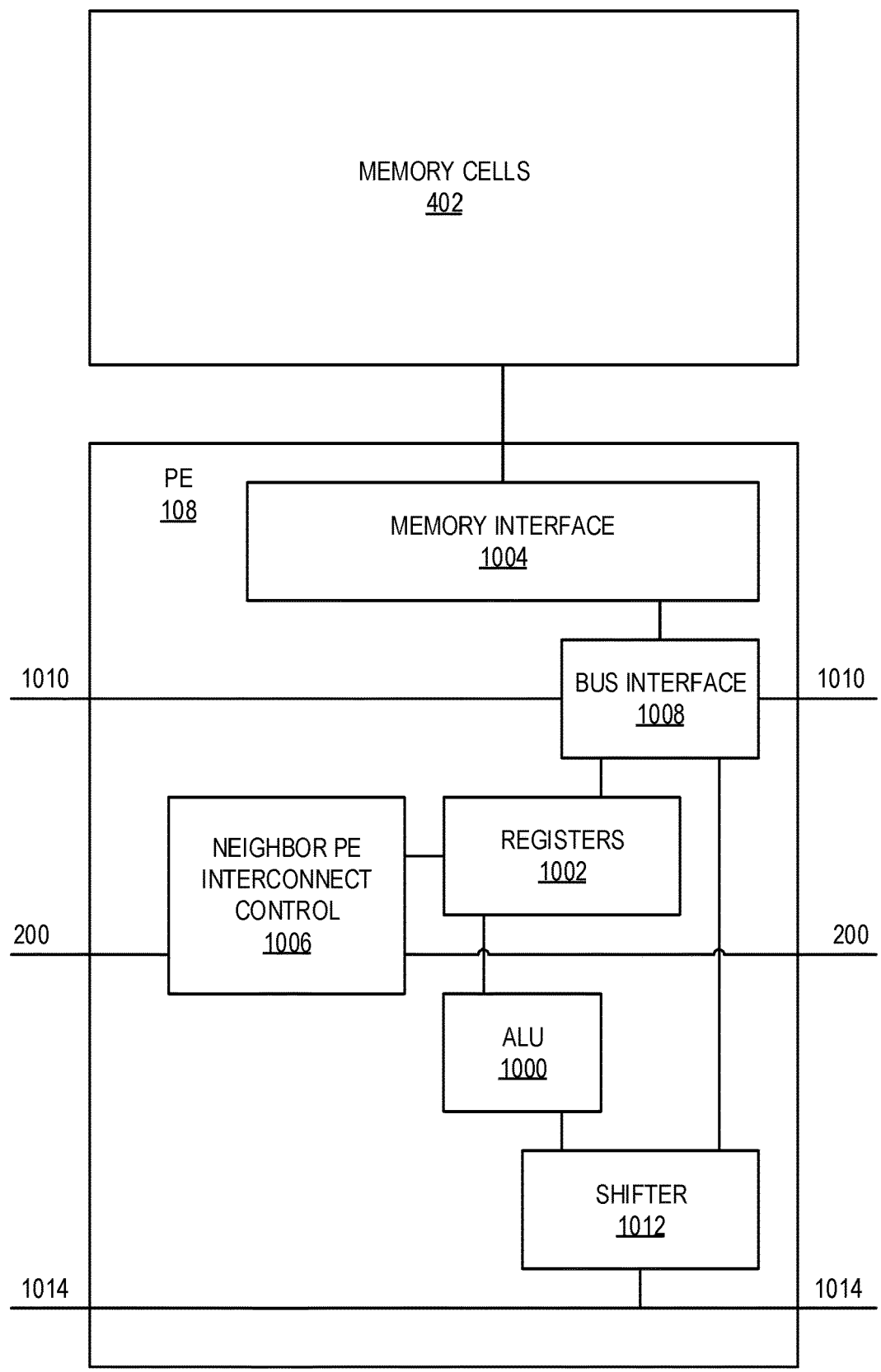
FIG. 9 is a block diagram of an example processing element and related memory cells.

FIG. 9 shows an example PE 108 schematically. The PE 108 includes an ALU 1000, registers 1002, a memory interface 1004, and neighbor PE interconnect control 1006.

The ALU 1000 performs the operational function of the PE. The ALU 1000 may include an adder, multiplier, accumulator, or similar. In various examples, the ALU 1000 is a multiplying accumulator. The ALU 1000 may be connected to the memory interface 1004, directly or indirectly, through the registers 1002 to share information with the memory cells 402. In this example, the ALU 1000 is connected to the memory interface 1004 though the registers 1002 and a bus interface 1008.

The registers 1002 are connected to the ALU 1000 and store data used by the PE 108. The registers 1002 may store operands, results, or other data related to operation of the ALU 1000, where such data may be obtained from or provided to the memory cells 402 or other PEs 108 via the neighbor PE interconnect control 1006.

The memory interface 1004 is connected to the memory cells 402 and allows for reading/writing at the memory cells 402 to communicate data with the registers 1002, ALU 1000, and/or other components of the PE 108.

The neighbor PE interconnect control 1006 connects to the registers 1002 and controls communication of data between the registers 1002 and like registers of neighboring PEs 108, for example via interconnections 200 (FIG. 2), and/or between a controller (see 106 in FIG. 3). The neighbor PE interconnect control 1006 may include a logic/switch array to selectively communicate the registers 1002 to the registers 1002 of neighboring PEs 108, such as first, second, fourth, or sixth neighbor PEs. The neighbor PE interconnect control 1006 may designate a single neighbor PE 108 from which to obtain data. That is, the interconnections 200 may be restricted so that a PE 108 only at most listens to one selected neighbor PE 108. The neighbor PE interconnect control 1006 may connect PEs 108 that neighbor each other in the same row. Additionally or alternatively, a neighbor PE interconnect control 1006 may be provided to connect PEs 108 that neighbor each other in the same column.

The PE may further include a bus interface 1008 to connect the PE 108 to a bus 1010, such as a direct memory access bus. The bus interface 1008 may be positioned between the memory interface 1004 and registers 1002 and may selectively communicate data between the memory interface 1004 and either a component outside the PE 108 connected to the bus 1010 (e.g., a main processor via direct memory access) or the registers 1002. The bus interface 1008 may control whether the memory 402 is connected to the registers 1002 or the bus 1010.

The PE may further include a shifter circuit 1012 connected to the ALU 1000 and a wide-add bus 1014 to perform shifts to facilitate performing operations in conjunction with one or more neighbor PEs 108.

Figure 10:
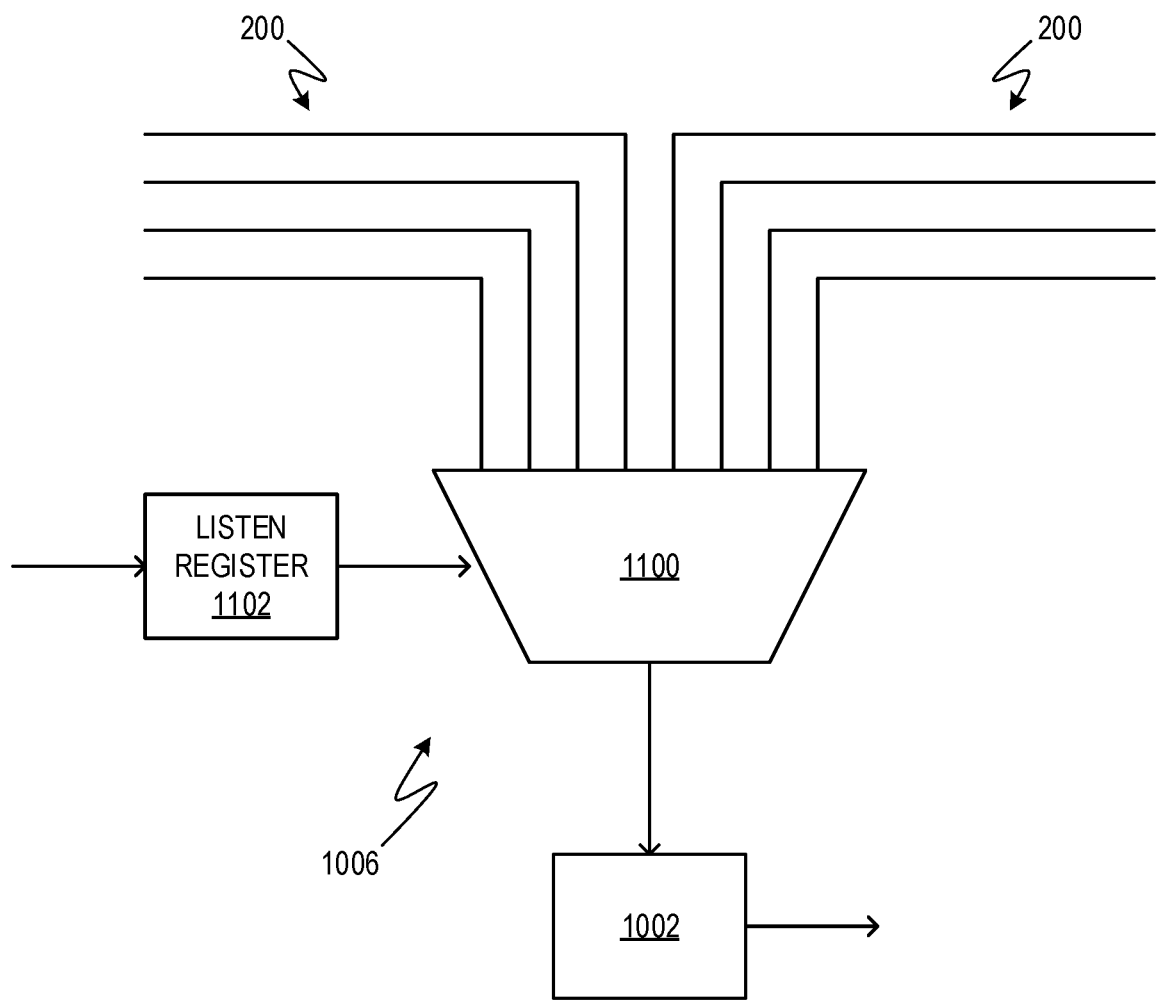
FIG. 10 is a block diagram of an example of the neighbor processing element interconnect control of FIG. 9.

FIG. 10 shows an example of the neighbor PE interconnect control 1006. The neighbor PE interconnect control 1006 includes a multiplexer 1100 or similar switch/logic array and a listen register 1102.

The multiplexer 1100 selectively communicates one interconnection 200 to a neighbor PE 108 to a register 1002 used for operations of the PE 108 to which the neighbor PE interconnect control 1006 belongs. Hence, a PE 108 listens to one neighbor PE 108.

The listen register 1102 controls the output of the multiplexer 1100, that is, the listen register 1102 selects a neighbor PE 108 as source of input to the PE 108. The listen register 1102 may be set by an external component, such as a controller 106 (FIG. 3), or by the PE 108 itself.

Figure 11:
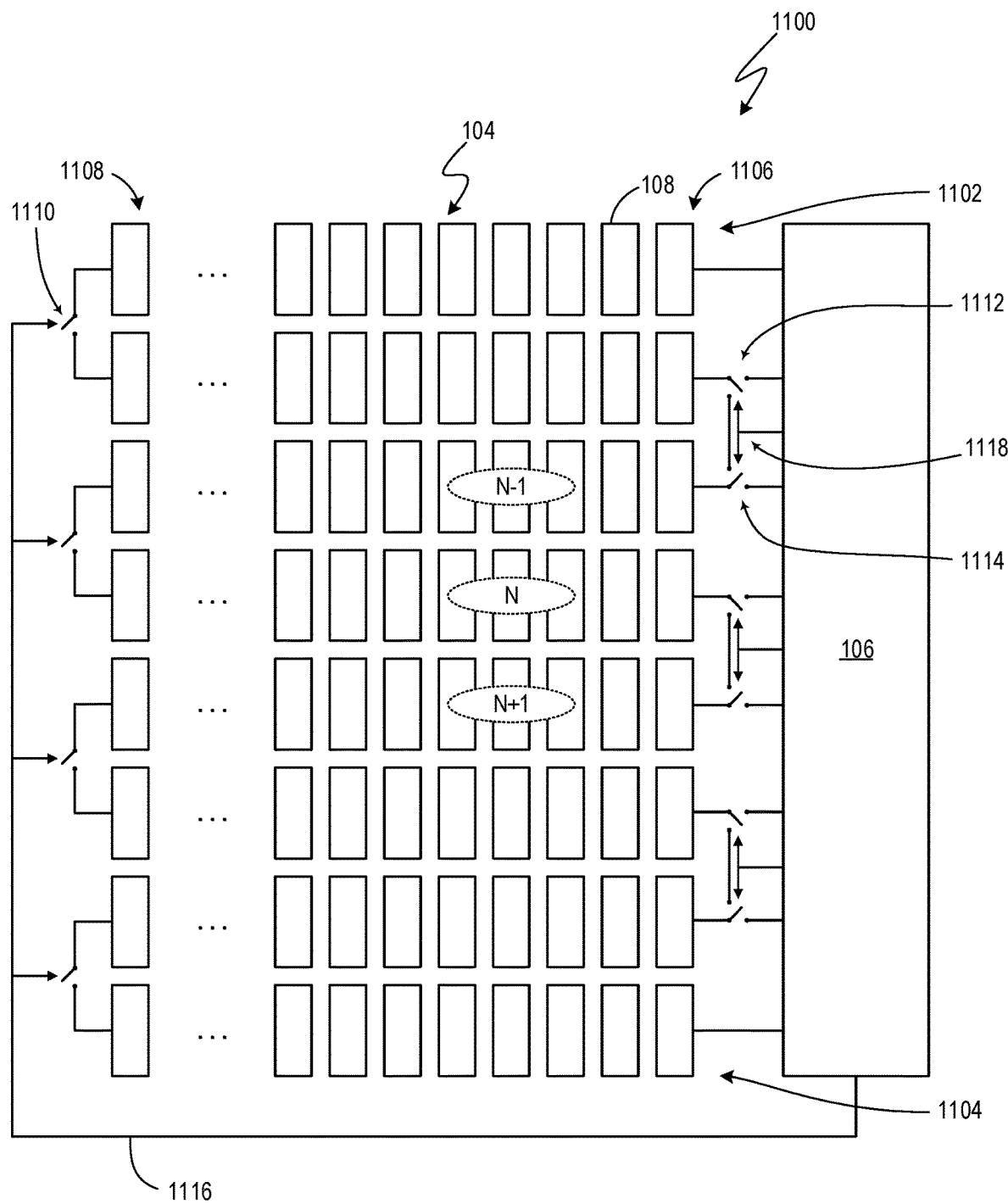
FIG. 11 is a block diagram of an example bank of processing elements with an array of processing rows and a switching circuit to couple rows together.

FIG. 11 shows a bank 1100 that may be used in a computing device, such as the computing device 100 of FIG. 1. Features and aspects of the other devices and methods described herein may be used with the bank 1100. Like reference numerals and like terminology denote like components, and redundant description will not be repeated here.

The bank 1100 includes an array of processing rows 104 and a switching circuit.

The array of processing rows 104 may include a first-end row 1102 and a second-end row 1104 positioned at opposite ends of the array of processing rows 104. The processing rows 104 may be arranged in a linear or stacked arrangement.

Each processing row 104 includes an array PEs 108, which may be arranged in a row or other linear pattern. Each processing row 104 includes a first-end PE 1106 and a second-end PE 1108 that are positioned at opposite ends of the processing row 104. The first-end PE 1106 of each row 104 may be positioned adjacent a controller 106. The second-end PE 1108 may be the PE 108 that is furthest from the controller 106.

The switching circuit selectively connects first-end PEs 1106 and second-end PEs 1108 of different processing rows 104. The switching circuit may include switches 1110, 1112, 1114. Each row 104 may be connected to a switch 1110 at its second-end PE 1108, so that the row 104 may be selectively connected to an adjacent row 104. That is, the second-end PEs 1108 of pairs of adjacent rows 104 may be selectively connectable via a switch 1110. Pairs of adjacent rows 104 may be selectively connectable either to each other or to the controller 106 via switches 1112, 1114. The adjacent pairs of rows 104 connectable by a switch 1110 may be offset by one row from the adjacent pairs of rows 104 connectable by switches 1112, 1114.

Figure 13A:
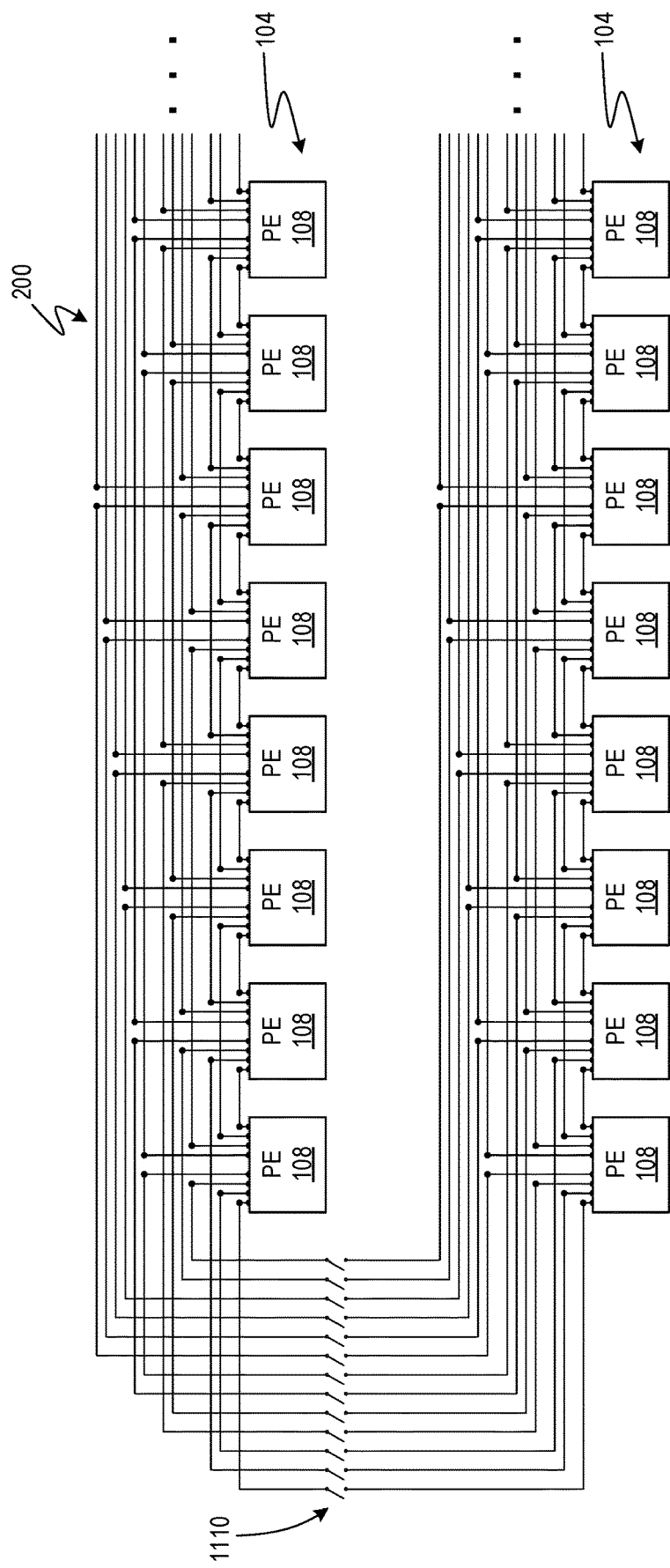
FIGS. 13A-B are block diagrams showing examples of switches connecting second ends of two rows of processing elements.
Figure 13B:
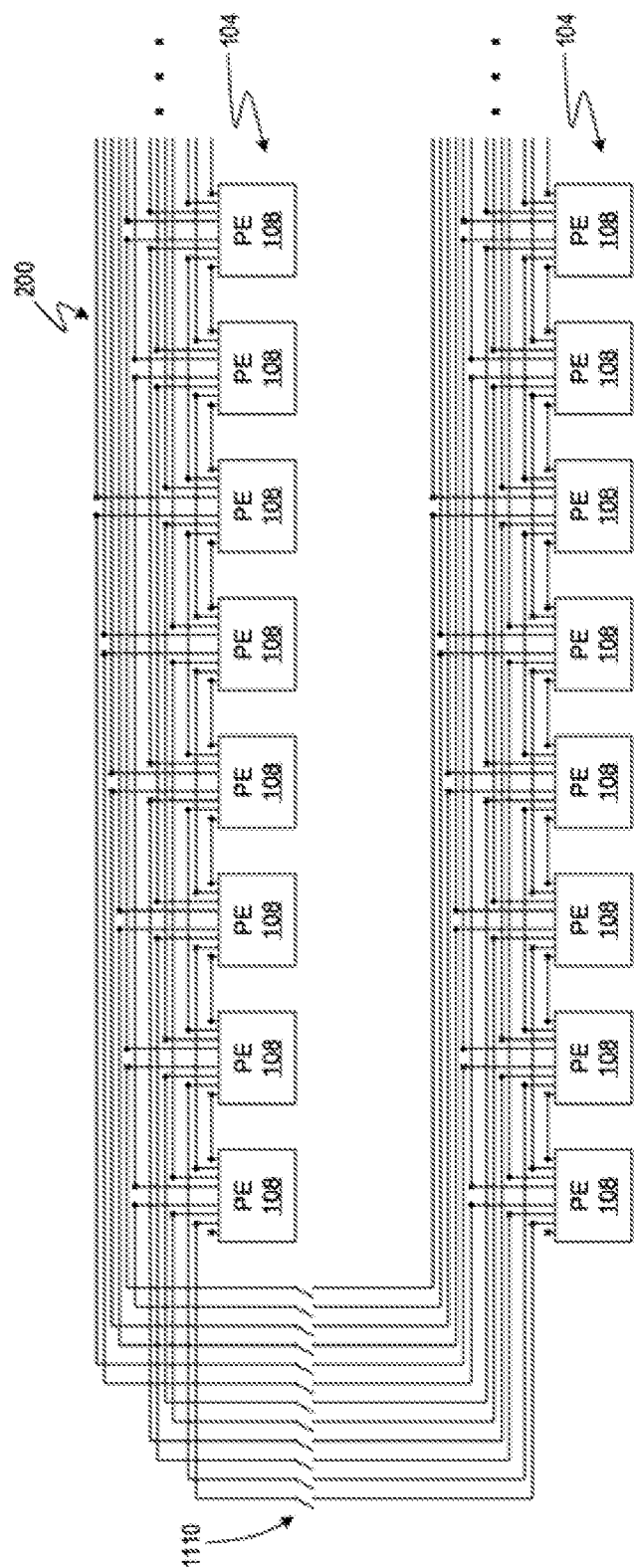

Switches 1110, 1112, 1114 may be provided as switches on interconnections 200 of adjacent PEs 108, as shown in FIG. 2. Byte order may be preserved when moving data between rows 104 by proper routing of interconnections. FIG. 13A shows an example of a switch 1110 connecting second ends of two rows 104. FIG. 13B shows another example of a switch 1110 connecting second ends of two rows 104 and preserving byte order. The switch 1110 includes a plurality of individual switches, one for each interconnection among PEs 108 of the rows 104. Switches 1112, 1114 may be designed using the same principle.

Given an array with an arbitrary number of processing rows 104, a first-end PE 1106 of an N processing row 104 may be selectively connectable to first-end PE 1106 of an N+1 processing row 104 by switches 1112, 1114. When not connected to each other, the N and N+1 rows 104 may be connected to the controller 106. A second-end PE 1108 of the N processing row 104 may be selectively connectable to second-end PE 1108 of an N-1 processing row 104 via a switch 1110. When not connected to each other, the N and N-1 processing rows 104 may have their second ends unconnected to a row 104 in the device 1100.

At the extents of the array of rows 104, the first-end row 1102 and the second-end row 1104 may be non-selectively connected to the controller 106. That is, the first-end row 1102 and the second-end row 1104 may be permanently connected to the controller 106, in that the first-end row 1102 and the second-end row 1104 are not selectively connectable to another row 104.

In various examples, only the first-end row 1102 and the second-end row 1104 lack selective connections to the controller 106. Each processing row 104 except the first-end row 1102 and the second-end row 1104 is selectively connectable to either the first-end PE 1106 of an adjacent row 104 or the controller 106.

The switching circuit, as may be embodied by the switches 1110, 1112, 1114, allows different mutual connections of the rows 104. Rows 104 may be combined to form super-rows of double, quadruple, or other factor of individual row size. This may allow for the processing of longer segments of information. For example, if each row 104 contains 1024 8-bit PEs 108, then the rows 104 may perform parallel operations on 1 kB of data, two rows 104 may be connected to perform parallel operations on 2 kB of data, four rows 104 may be connected to perform parallel operations on 4 kB of data, and so on.

The switching circuit may be controlled by the controller 106. The second-end switches 1110 may be controlled via a common signal line 1116 that provides a second-end control signal from the controller 106. Pairs of adjacent rows 104 may therefore all be controlled together to have second-end PEs 1108 connected or disconnected. Each set of first-end switches 1112, 1114 may be controlled by a first-end signal line 1118 that provides a first-end control signal from the controller 106. As such, pairs of adjacent rows 104 may be individually controlled to have their first-end PEs 1106 either mutually connected or connected to the controller 106. Accordingly, the common signal line 1116 may carry an enable or disable signal depending on whether or not the connecting of rows 104 in general is to be enabled or disabled. Further, each individual first-end signal lines 1118 may carry an enable or disable signal to facilitate the specific super-rows desired.

FIGS. 12A-E show examples of various interrow connections that may be made with reference the device 1100 of FIG. 11. Eight contiguous rows 104 are shown as an example and it should be appreciated that more or fewer may be provided.

Figure 12A:
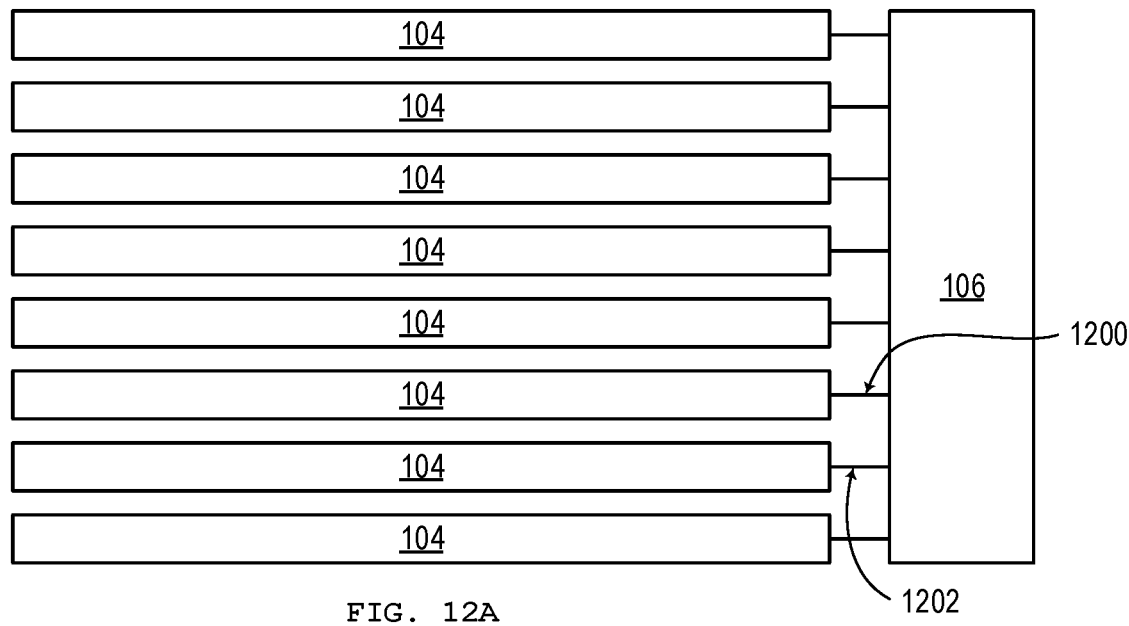
FIGS. 12A-E are schematic diagrams showing examples of various interrow connections that may be made with reference the example bank of FIG. 11.

In FIG. 12A, no interrow connections are enabled, and the result is eight individual rows of processing elements. A connection 1200 of a row 104 to the controller 106 may be provided through a switch 1112 (FIG. 11). A connection 1202 of an adjacent row 104 to the controller 106 may be provided through a switch 1114 (FIG. 11).

Figure 12B:
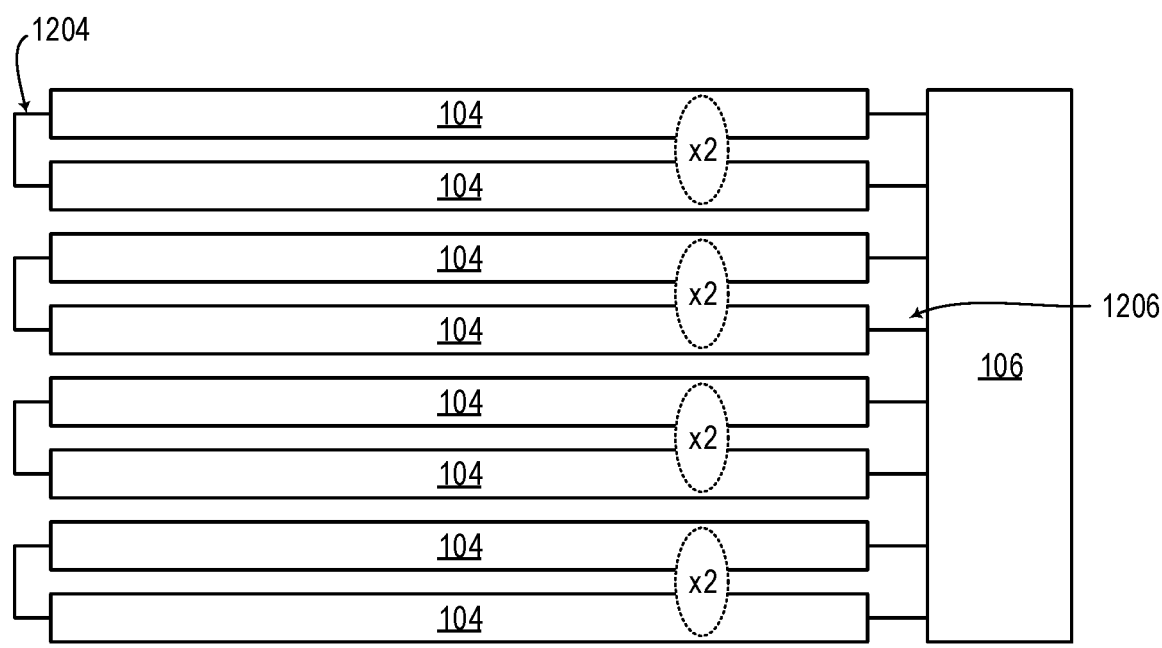

In FIG. 12B, interrow connections provide four double rows. Connections 1204 at second-ends of adjacent rows may be provided through switches 1110 (FIG. 11). Meanwhile, all switches 1112, 1114 (FIG. 11) at the controller ends of the rows 104 may provide connections 1206 to the controller 106.

Figure 12C:
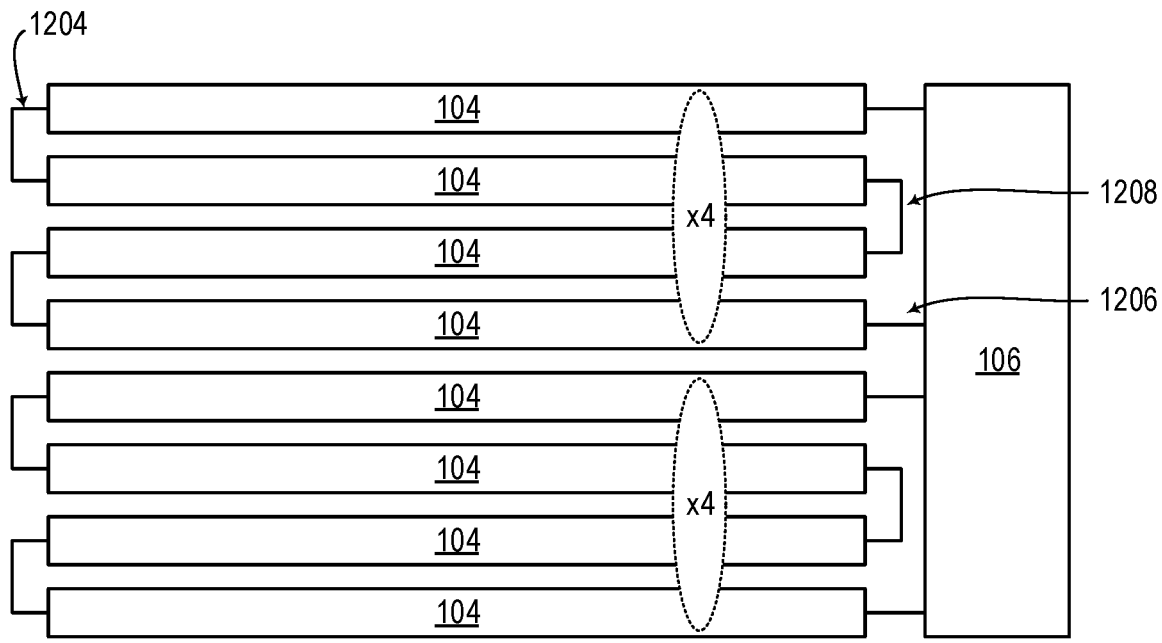

In FIG. 12C, interrow connections provide two quadruple rows of processing elements. Pairs of switches 1112, 1114 (FIG. 11) at the controller ends of the rows 104 may, in an alternating manner, provide row-to-row connections 1208 and connections 1206 to the controller 106.

Figure 12D:
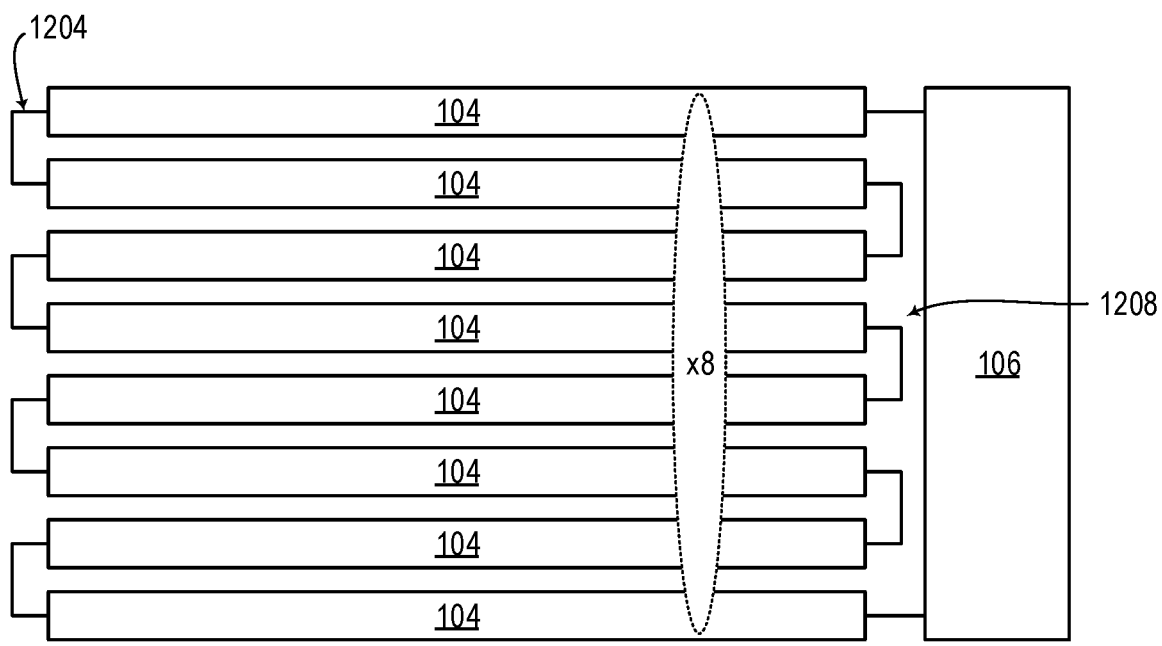

In FIG. 12D, interrow connections provide one octuple row. Switches 1112, 1114 (FIG. 11) at the controller ends of the rows 104 may be used to provide row-to-row connections 1208, except for end-most rows 104 that may be permanently or non-switchably connected to the controller 106.

Figure 12E:
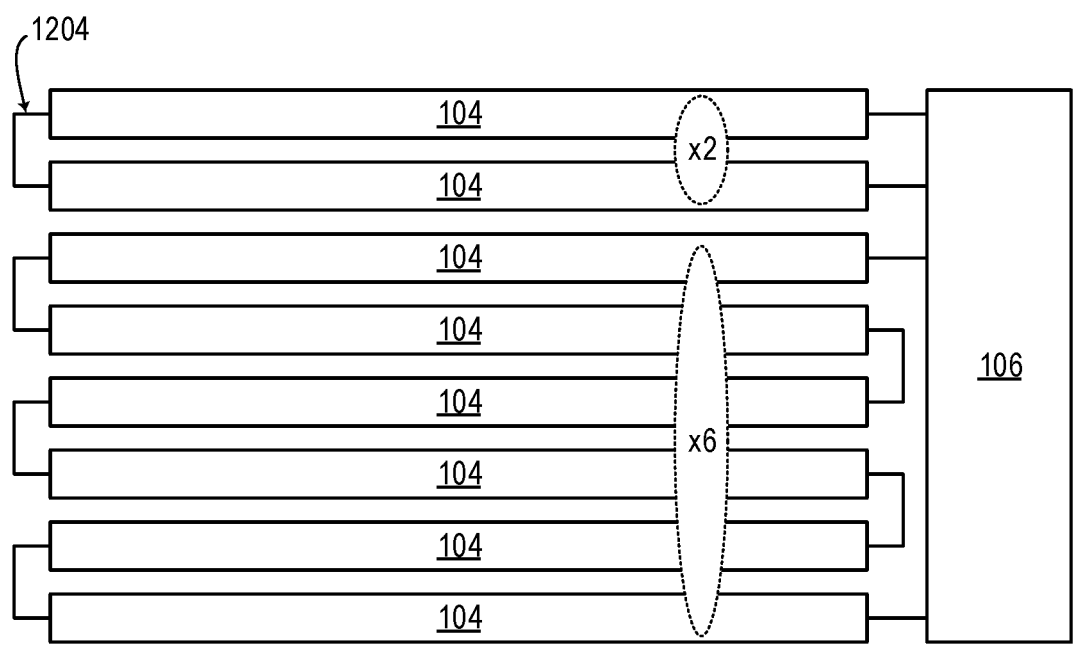

In FIG. 12E, interrow connections provide combined rows of double and six-times size of a single row 106. Various other combinations of combined rows are contemplated.

Figure 14:
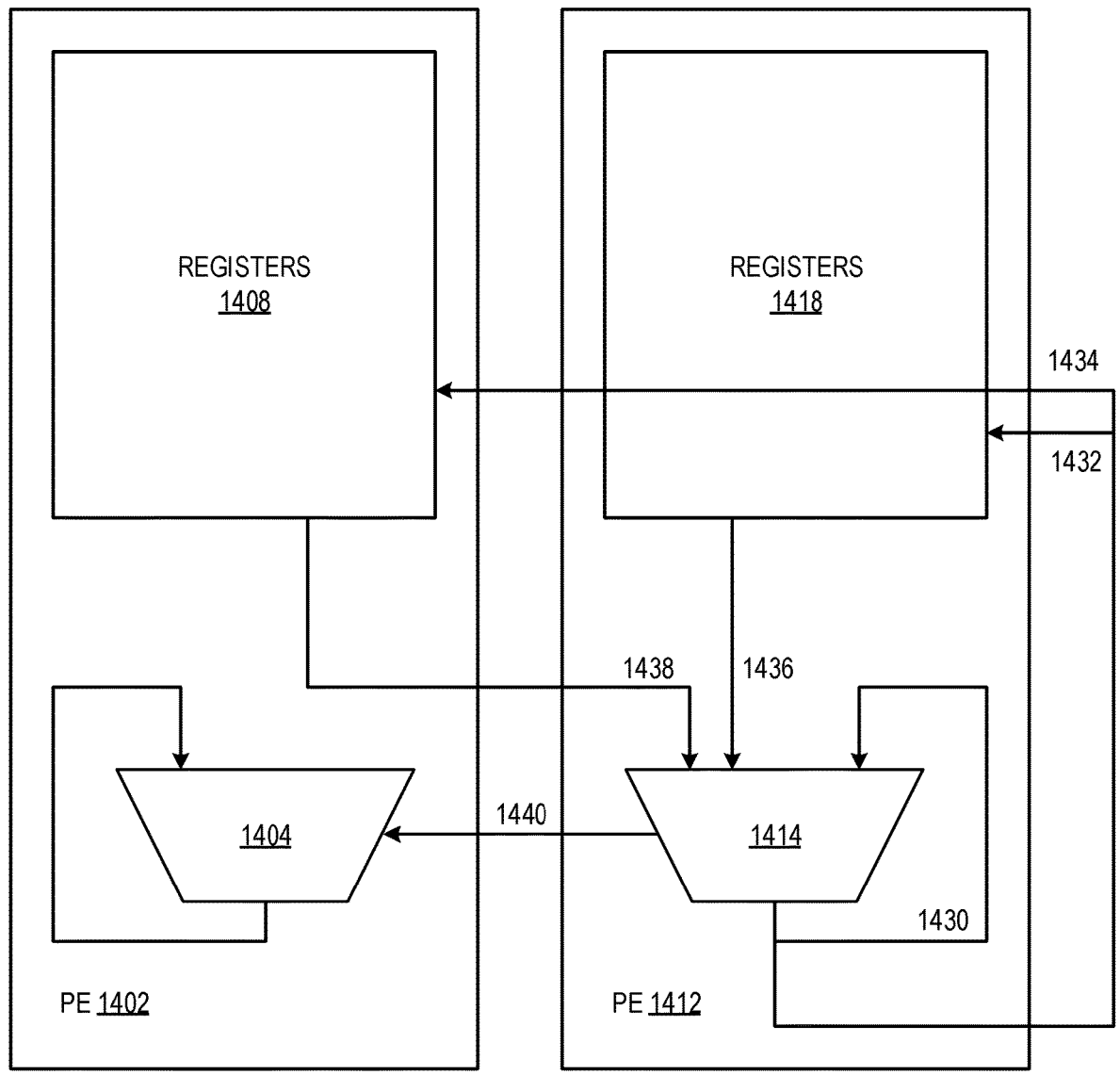
FIG. 14 is a block diagram of processing elements that may be selectively paired to operate at increased bit widths.

FIG. 14 shows example, PEs 1402, 1412 that may be selectively paired to operate at increased bit widths. For example, each PE 1402, 1412 may individually operate on 4 bits and pairing them may allow for 8-bit operations to be performed.

Each PE 1402, 1412 may include a respective accumulator 1404, 1414 and respective registers 1408, 1418. The accumulators 1404, 1414 may be configured to have four times the bit size of a single PE 1402, 1412 (e.g., 16 bits) to allow for a large number (e.g., 256) of multiplication and accumulation operations on 4-bit values without overflow.

In an example operation, a 4-bit PE 1412 performs a sequence of multiplications and accumulations 1430. The PE 1412 may multiply two 4-bit numbers to obtain an 8-bit number and then perform addition of 8-bit numbers. This may obtain an intermediate result of 16-bits at the accumulator 1414. The PE 1412 may store the 16-bit intermediate result by storing 8 bits in its registers 1418 and storing the remaining 8 bits in the registers 1408 of the adjacent PE 1404, as indicated at 1432 and 1434 respectively. That is, the 16-bit intermediate value may be split into two separate 8-bit components for storage in the separate sets of registers 1418, 1408 of the neighboring PEs 1414, 1402. The registers 1418 associated with the PE 1412 may be used to store the least-significant bits, while the neighboring registers 1408 may be used to store the most-significant bits.

Subsequently, the PE 1412 is to add a current value, which may be of 16 bits, with the 16-bit value stored in registers 1408, 1418. The accumulator 1414 of the PE 1412 obtains 1436 the 8-bit component from the associated registers 1418 and also obtains 1438 the other 8-bit component from the registers 1408 of the neighboring PE 1404. The two 8-bit components are concatenated into a 16-bit value that may then be added to a current 16-bit value, already present in the accumulator 1414. By linking 1440 the accumulators 1404, 1414, the addition may be carried over from the accumulator 1414 to the neighboring accumulator 1404 to allow for a 32-bit result, which ultimately may be scaled or truncated as needed. As such, the PEs 1402, 1412 may cooperate on data of bit sizes larger than their individual sizes.

For the paired, wide addition operation, such as described above, the accumulators 1404, 1414 may be temporarily linked 1440 such that they act as a single double-width accumulator (e.g., of 32 bits). The linkage 1440 allows carry over from the most-significant bit (MSB) of the accumulator 1414 to the least-significant bit (LSB) of the neighboring accumulator 1404. If the value is signed, then a sign bit may be carried over from the accumulator 1414 to the neighboring accumulator 1404.

The linkage 1440 is selectable and may be deactivated to operate the PEs 1402, 1412 independently and without the capacity to handle wider operations.

Figure 15:
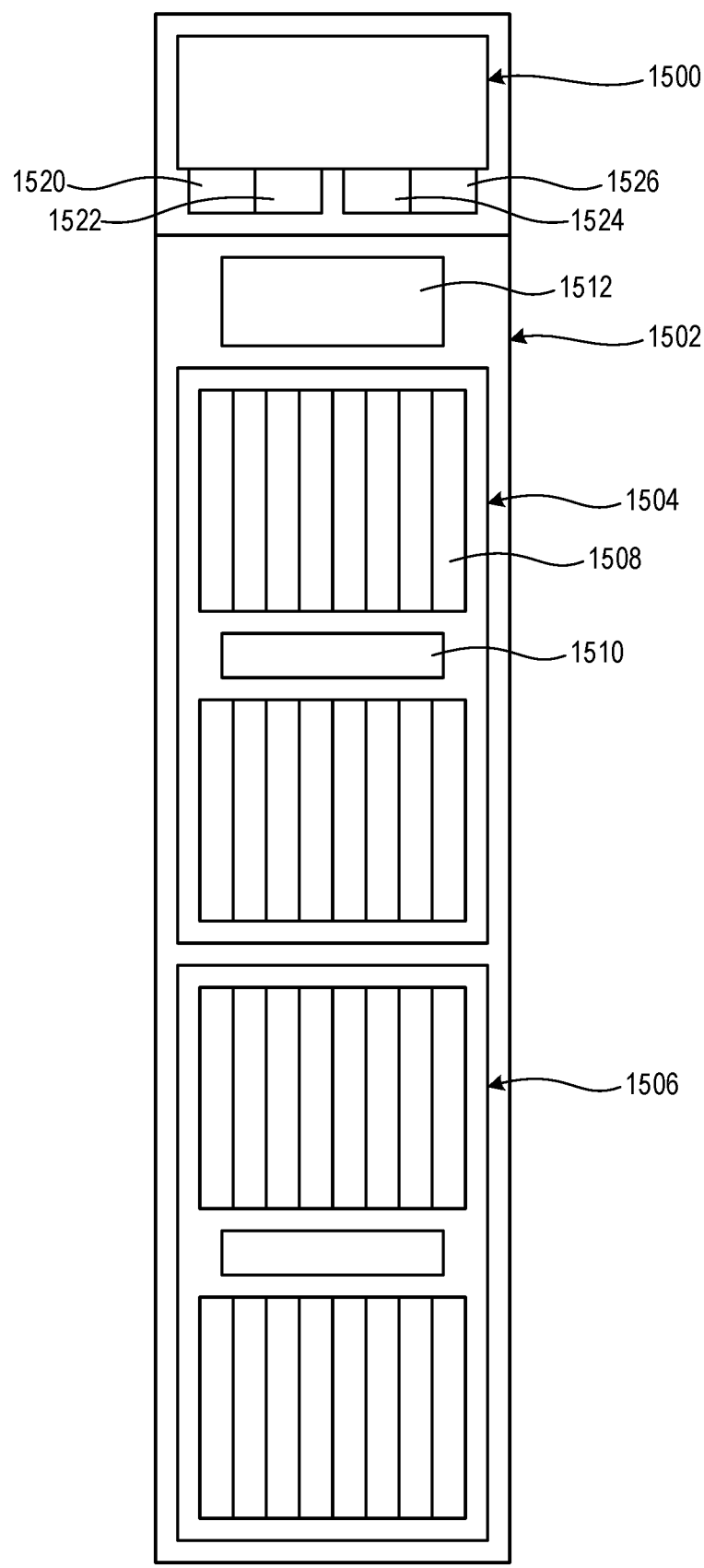
FIG. 15 is a block diagram of an example processing element and associated memory arrangement.

FIG. 15 shows a diagram of an example PE 1500 and its associated memory 1502. The memory 1502 may be arranged into blocks, so that the PE 1500 may access one block at the same time that an external process, such as direct memory access, accesses another block. Such simultaneous access may allow for faster overall performance of a row, bank, or other device containing the PE, as the PE and external process can perform operations with different blocks of memory at the same time and there will be fewer occasions of the PE or external process having to wait for the other to complete its memory access. In general, PE access to memory is faster than outside access, so it is expected that the PE 1500 will be able to perform N memory operations to one block per one outside operation to the other block.

The memory 1502 includes two blocks 1504, 1506, each containing an array of memory cells 1508. Each block 1504, 1506 may also include a local I/O circuit 1510 to handle reads/writes to the cells of the block 1504, 1506. In other examples, more than two blocks may be used.

The memory 1502 further includes a global I/O circuit 1512 to coordinate access by the PE and external process to the blocks 1504, 1506.

The PE 1500 may include memory access circuits 1520-1526, such as a most-significant nibble (MSN) read circuit 1520, a least-significant nibble (LSN) read circuit 1522, an MSN write circuit 1524, and an LSN write circuit 1526. The memory access circuits 1520-1526 are connected to the global I/O circuit 1512 of the memory 1502.

The memory address schema of the blocks 1504, 1506 of memory 1502 may be configured to reduce latency. In this example, block 1504 contains cells 1508 with even addresses and the block 1506 contains cells 1508 with odd addresses. As such, when the PE 1500 is to write to a series of addresses, the global I/O circuit 1512 connects the PE 1500 in an alternating fashion to the blocks 1504, 1506. That is, the PE 1500 switches between accessing the blocks 1504, 1506 for a sequence of memory addresses. This reduces the chance that the PE 1500 will have to wait for a typically slower external memory access. Timing between block access can overlap. For example, one block can still be finishing latching data into an external buffer while the other block is concurrently providing data to the PE 1500.

Figure 16:
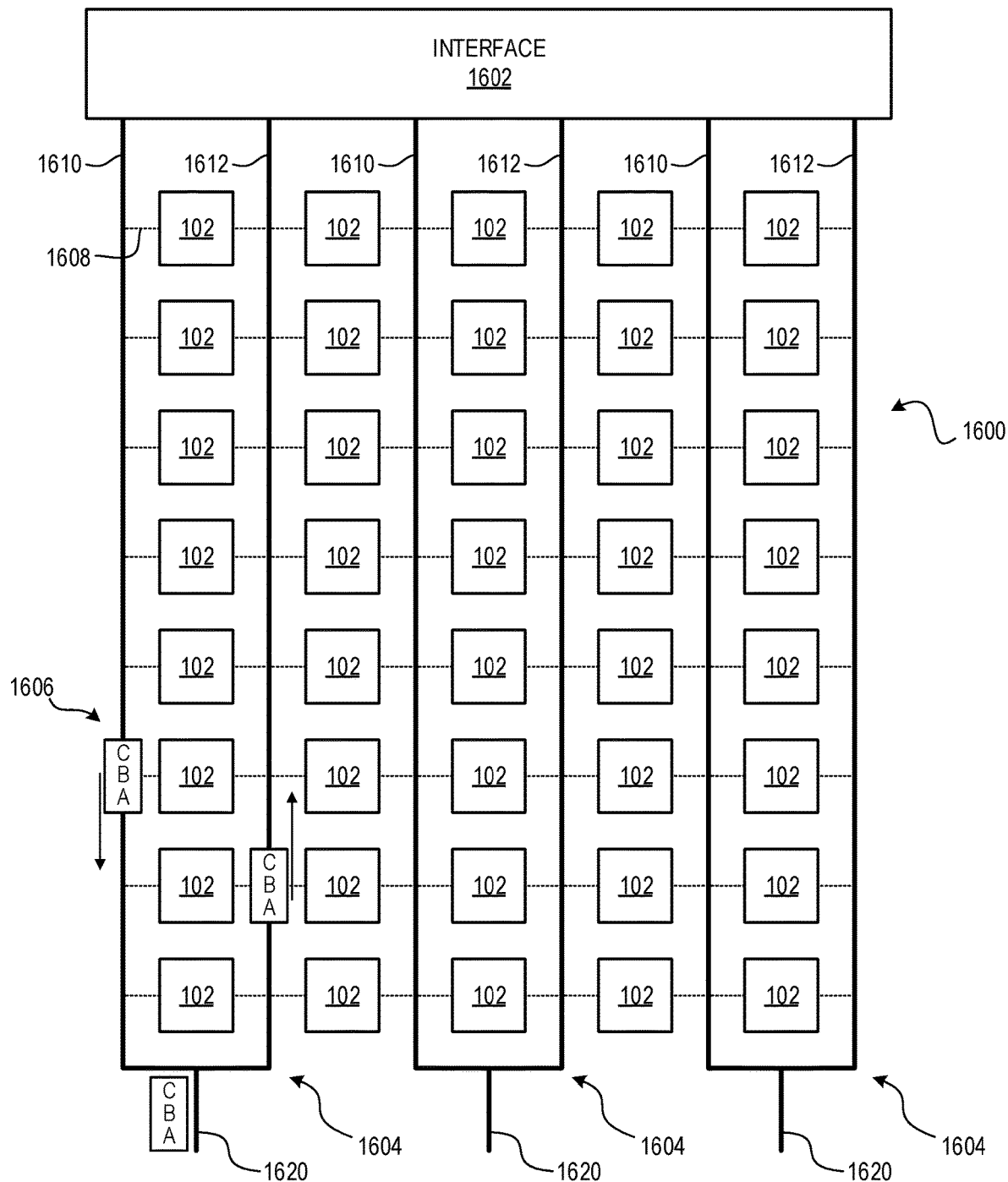
FIG. 16 is a block diagram of an example two-dimensional array of processing banks connected to an interface.

FIG. 16 shows an example two-dimensional array 1600 of processing banks 102 connected to an interface 1602 via I/O busses 1604. The array 1600 may be grid-like with rows and columns of banks 102. Rows need not have the same number of banks 102, and columns need not have the same number of banks 102.

The interface 1602 may connect the I/O busses 1604 to a main processor, such as a CPU of a device that contains the array 1600. The interface 1602 may be a PCIe interface.

The interface 1602 and buses 1604 may be configured to communicate data messages 1606 with the banks 102. The interface 1602 may pump messages through the busses 1604 with messages becoming accessible to banks 102 via bus connections 1608. A bank 102 may read/write data from/to a message 1606 via a bus connection 1608.

Each bus 1604 includes two legs 1610, 1612. Each leg 1610, 1612 may run between two adjacent columns of banks 102. Depending on its column, a given bank 102 may have bus connections 1608 to both legs 1610, 1612 of the same bus 1604 or may have bus connections 1608 to opposite legs 1610, 1612 of adjacent busses. In this example, even columns (e.g., $0^{th}$, $2^{nd}$, $4^{th}$) are connected to the legs 1610, 1612 of the same bus 1604 and odd columns (e.g., $1^{st}$, $3^{rd}$) are connected to different legs 1610, 1612 of adjacent busses 1604.

In each bus 1604, one end of each leg 1610, 1612 is connected to the interface 1602, and the opposite end of each leg 1610, 1612 is connected to a reversing segment 1620. Further, concerning the direction of movement of messages on the bus 1604, one leg 1610 may be designated as outgoing from the interface 1602 and the other leg 1612 may be designated as incoming to the interface 1602. As such, a message 1606 put onto the bus 1604 by the interface 1602 may be pumped along the leg 1610, through the reversing segment 1620, and back towards the interface 1602 along the other leg 1612.

The reversing segment 1620 reverses an ordering of content for each message 1606, such that the orientation of the content of each message 1606 remains the same relative to the PEs of the banks 102, regardless of which side of the bank 102 the message 1606 is on. This is shown schematically as message packets "A," "B," and "C," which are discrete elements of content of a message 1606. As can be seen, the orientation of the packets of the message 1606 whether on the leg 1610 or the leg 1612 is the same due to the reversing segment 1620. This is shown in detail in FIG. 17. Without the reversing segment, i.e., with a simple loop bus, the orientation of the message 1606 on the return leg 1612 would be opposite.

Figure 17:
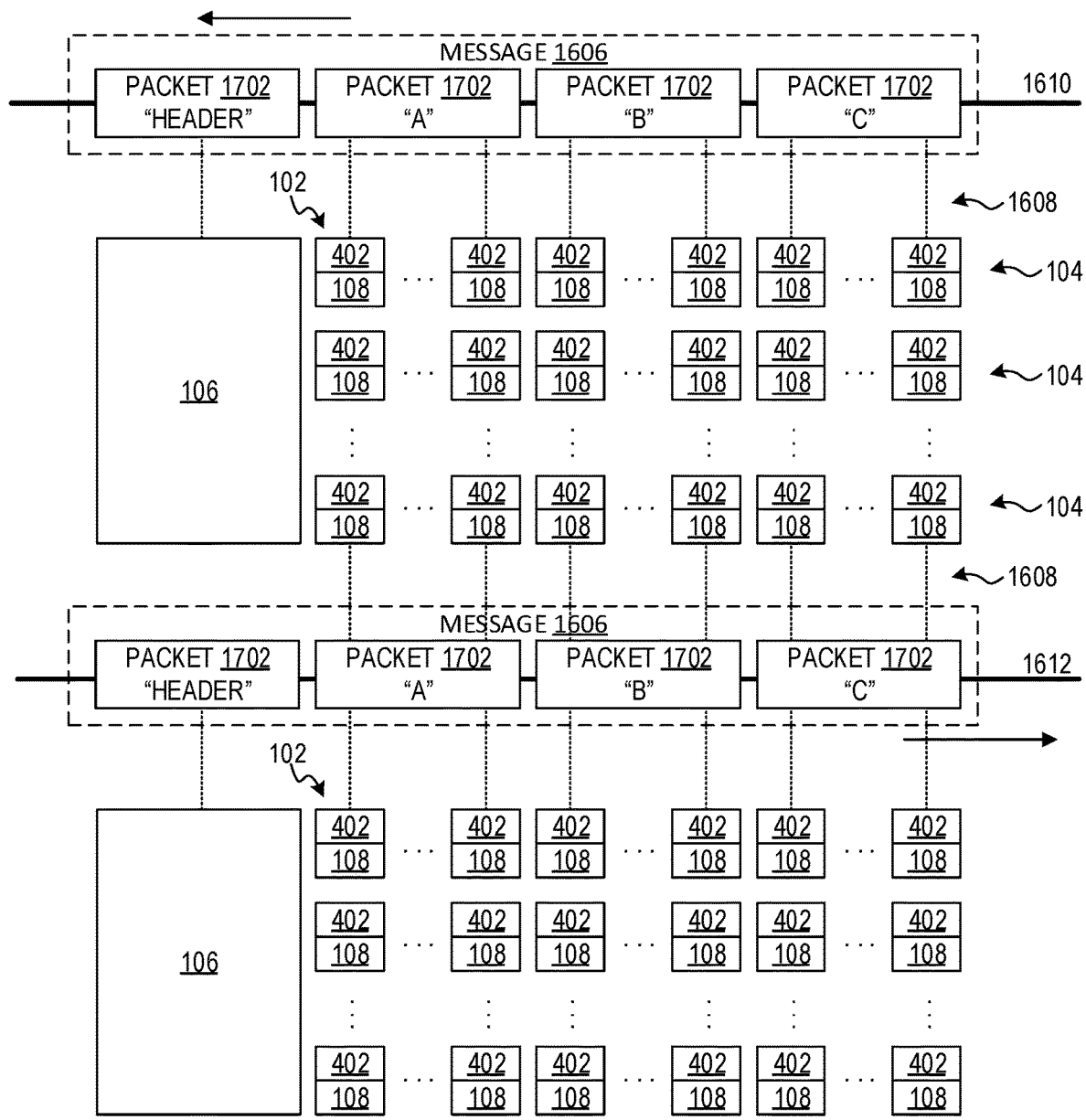
FIG. 17 is a block diagram of an example of the reversing segment of FIG. 16.

As shown in FIG. 17, the reversing segment 1620 provides that the packets 1702 "A," "B," and "C," of a message 1606 have the same orientation relative to the PEs 108 and respective memory cells 402, as arranged in rows 104 of various banks 102, irrespective of the position of the bank 102 relative to bus legs 1610, 1612. That is, the grid like arrangement of PEs 108 and respective memory cells 402 may be made the same for each bank 102 without needing to accommodate the flipping of message content. Rather, message content is flipped once at the appropriate time via the reversing segment 1620.

A message 1606 may include any number of packets 1702. Each packet 1702 may have a length that corresponds to a particular number of PEs 108 and respective memory cells 402. For example, a packet 1702 may be 128 bits wide which may correspond to 16 PEs 108 that each have 8-bit wide memory cells 402. A row 104 of 256 PEs 108 therefore aligns with 16 packets 1702. A message 1606 may therefore be formed of 16 packets 1702 with one header packet that includes source/destination information, and which may be read by the controller 106. The packets 1702 are reordered by the reversing segment 1620. However, their content is not reordered. For example, the 16 8-bit elements of a 128-bit packet "A" remain in the same order as the packet "A" is moved from first to last of a stream of packets "A," "B," and "C."

Figure 18:
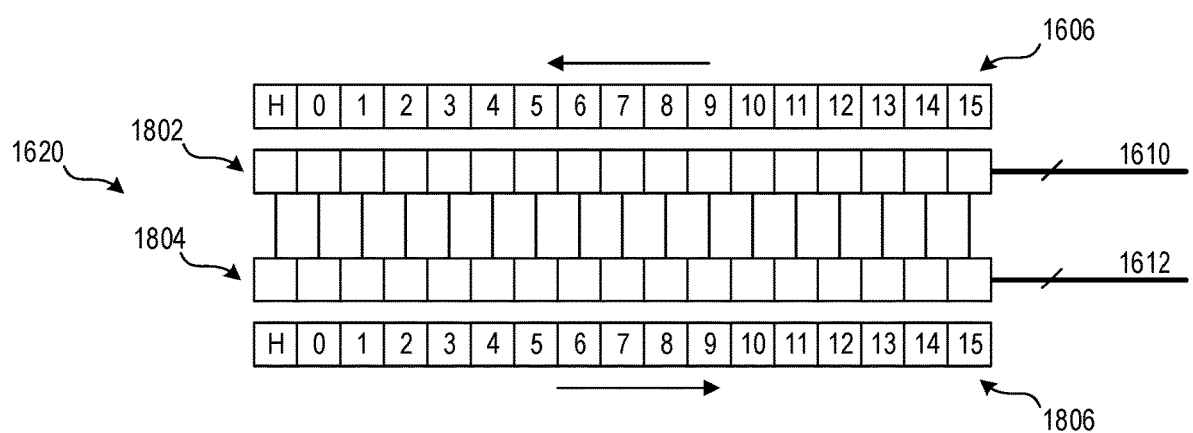
FIG. 18 is a block diagram of another example of the reversing segment of FIG. 16.

FIG. 18 shows an example reversing segment 1620. The reversing segment 1620 includes two buffers 1802, 1804. A message 1606 (with packets shown as H for header packet and 0-15 for data packets) is clocked into the first buffer 1802, packet-wise in the direction of the bus leg 1610, until the entire message 1606 is present in the buffer 1802. The content of the buffer 1802 is then copied to the second buffer 1804, preserving the order of the packets with respect to the buffers 1802, 1804 but reversing the order of the packets with respect to the directions of the legs 1610, 1612. The copy of the message 1806 in the second buffer 1804 is then clocked out, packet-wise in the direction of the bus leg 1612, of the reversing segment 1620. It should be noted that the header packet moves to the end of the message 1806 with respect to the direction of the bus leg 1612, and this accommodates the same relative positions of the controllers 106 with respect to the PE rows 104 (see FIG. 17).

Figures 19A, 20:
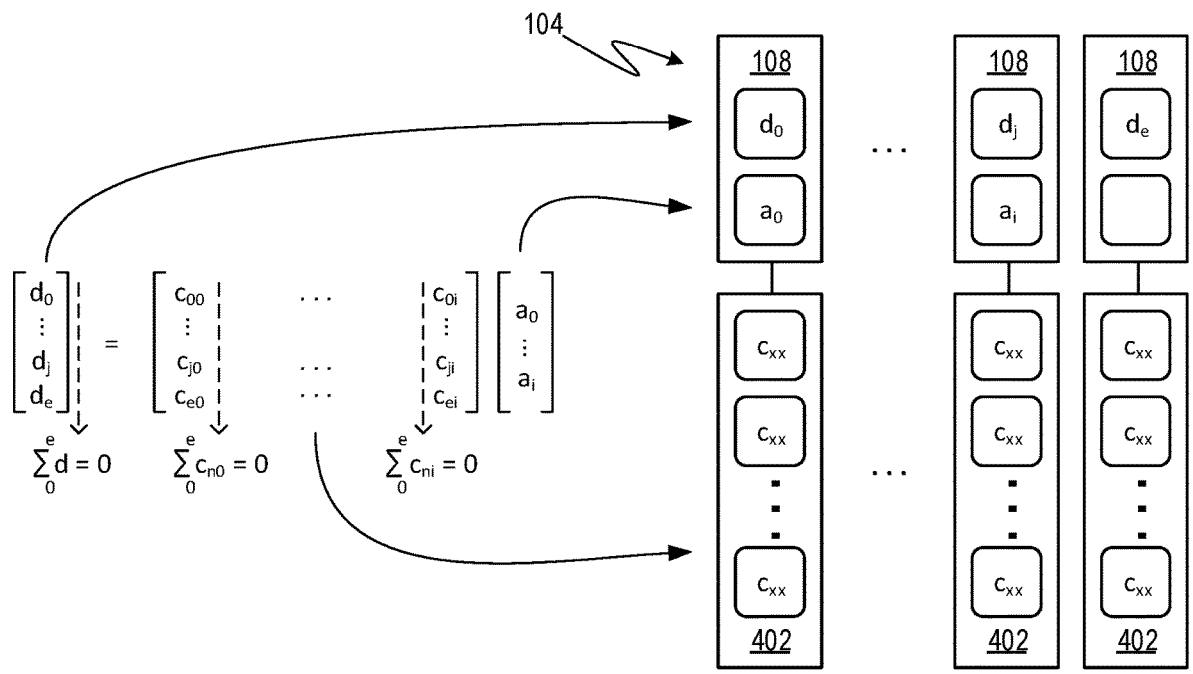
FIG. 19A is a schematic diagram of an example error checking scheme that may be used with a row of processing elements.
FIG. 20 is an equation showing a numerical example of the error checking scheme of FIGS. 19A and 19B.

FIG. 19A shows an example of an error checking scheme that may be used with a row of PEs, such as a row 104 of PEs 108 with memory 402 that may be provided as part of a processing bank 102. A corresponding method may be implemented by a non-transitory machine-readable medium, such as random-access memory (RAM) or electrically erasable programmable read-only memory (EEPROM), that includes executable instructions. The error checking method may be implemented by a controller, such as the controller 106, and PEs 108 working in conjunction. A non-transitory machine-readable medium may be accessible or integral to the controller 106 for execution of instructions by the controller 106.

A coefficient matrix is provided with an additional row of values $c_{e0}$ to $c_{ei}$ for multiplication with an input vector $a_0$ to $a_i$. Accordingly, the result vector $d_0$ to $d_e$ contains an additional, error-checking element $d_e$.

Each error checking value $c_{e0}$ to $c_{ei}$ is selected to be the negative sum of its column. For example, the value of $c_{e0}$ is the negative sum of $c_{00}$ to $c_{j0}$, and so on, with the value of $c_{ei}$ being set to the negative sum of $c_{0i}$ to $c_{ij}$. These error checking values $c_{e0}$ to $c_{ei}$ may be loaded into PE memory 402 along with the coefficients $c_{00}$ to and may be treated the same. Any coefficient arrangement may be used, indicated generally as $c_{xx}$, such as those described herein.

Multiplying accumulation is then performed with the result vector $d_0$ to $d_e$ accumulating at respective PEs 108. The elements of input vector $a_0$ to $a_i$ may be rotated during this process, as discussed herein.

Once multiplying accumulation is completed, all elements except the last element of the result vector, i.e., $d_0$ to $d_j$, represent the result. Further, all elements including the last, error-checking element $d_e$ of the result vector, i.e., $d_0$ to $d_e$ may be summed. The expected sum of $d_0$ to $d_e$ is zero due to the selection methodology for error checking values $c_{e0}$ to $c_{ei}$. As such, if the sum of $d_0$ to $d_e$ is not zero, then an error may be determined to have occurred. The multiplying accumulation may be redone or other error correction action may be taken, such as using different PEs 108 or a different row 104 of PEs 108.

In addition, particularly if a large number of coefficient rows are used (e.g., 256), to reduce the cost of summation of all elements of the result vector $d_0$ to $d_e$, a set of least significant bits (e.g., four LSBs) may be retained during the summation with higher order bits being discarded.

Figure 19B:
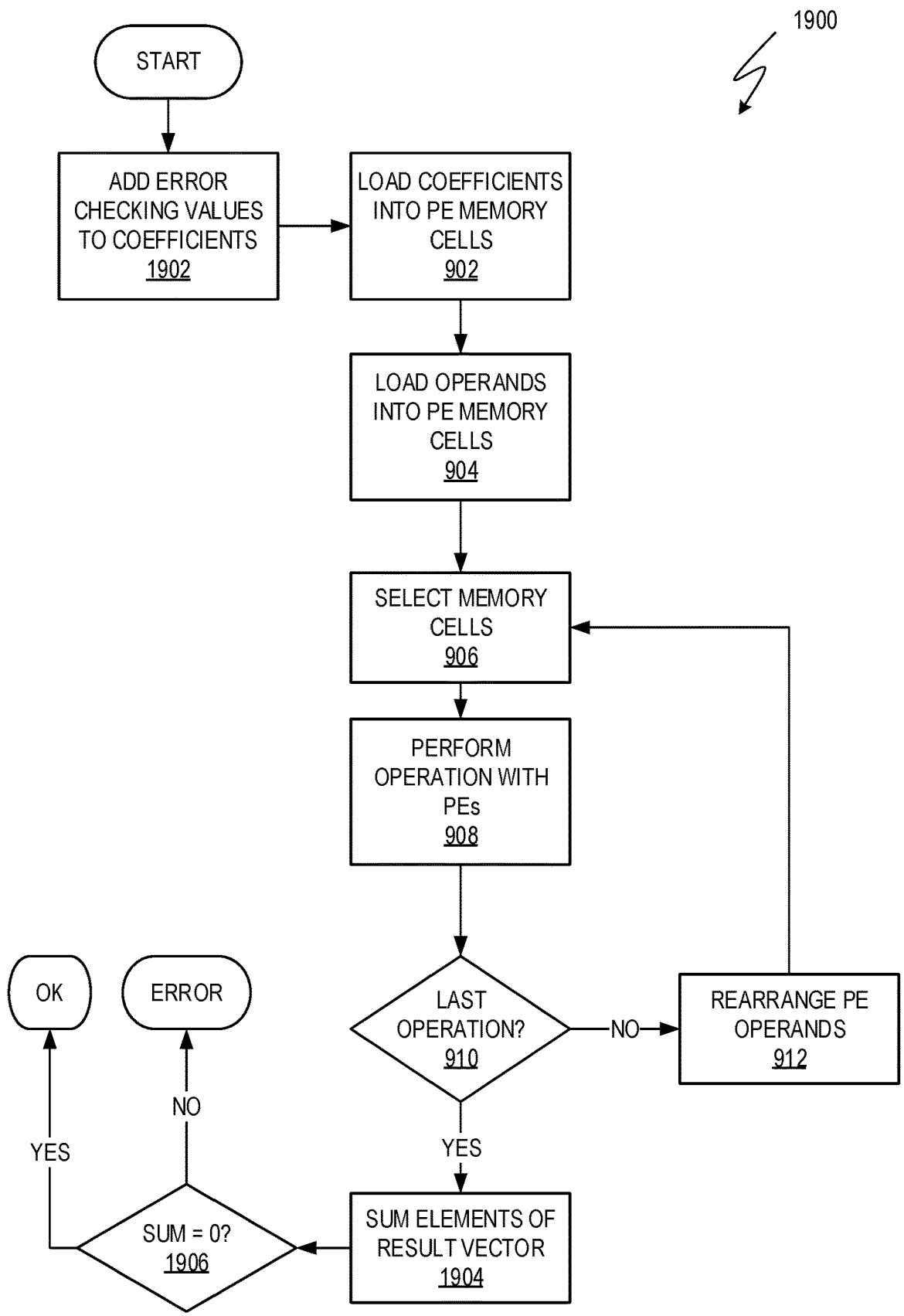
FIG. 19B is a flowchart of an example method of performing operations using processing elements and memory cells with error detection.

With reference to FIG. 19B, a method 1900 that implements the above-discussed error checking technique is shown. The method 1900 may be implemented by instructions executable by the device 100 or a controller 106 thereof. The instructions may be stored in a non-transitory computer-readable medium integral to the device 100 or controller 106. In addition, the description for the method 900 of FIG. 8 may be referenced for details not repeated here. The method 1900 operates on an array of PEs.

At block 1902, a row of error-checking values is added to a matrix of coefficients. Each error-checking value is a negative sum of a respective column of the matrix of coefficients. As far as the PEs are concerned, the error-checking values are data just like the coefficients.

Then, the matrix of coefficients, including the error-checking values, are into the array of PEs as serialized coefficients (block 902), an input vector is loaded into the array of PEs (block 904), and the array of PEs is controlled to perform an operation with the matrix of coefficients and the input vector to obtain a result vector (blocks 906-912).

When the operation is complete, via block 910, the elements of the result vector are summed, at block 1904. An error in the operation is detected when the sum is non-zero, at block 1906. Otherwise, the operation was completed successfully, and the result vector may be outputted. The error-checking element of the result vector may be discarded.

FIG. 20 shows a simple numerical example. As can be seen, an error checking row [−2 0] is added to the coefficient matrix, where −2 is the negative sum of the elements 1 and 1 in the first column and 0 is the negative sum of elements 1 and −1 in the second column. Accordingly, when multiplying the coefficient matrix with vector [a b], the expected result includes error checking element −2a, which when summed with the desired result elements a+b and a−b should yield 0. A non-zero result indicates that an error has occurred. For example, if the first element of the result is 2a+b instead of the correct a+b, the sum of all elements in the result vector will be a, and thereby an error will be detected.

Figure 21:
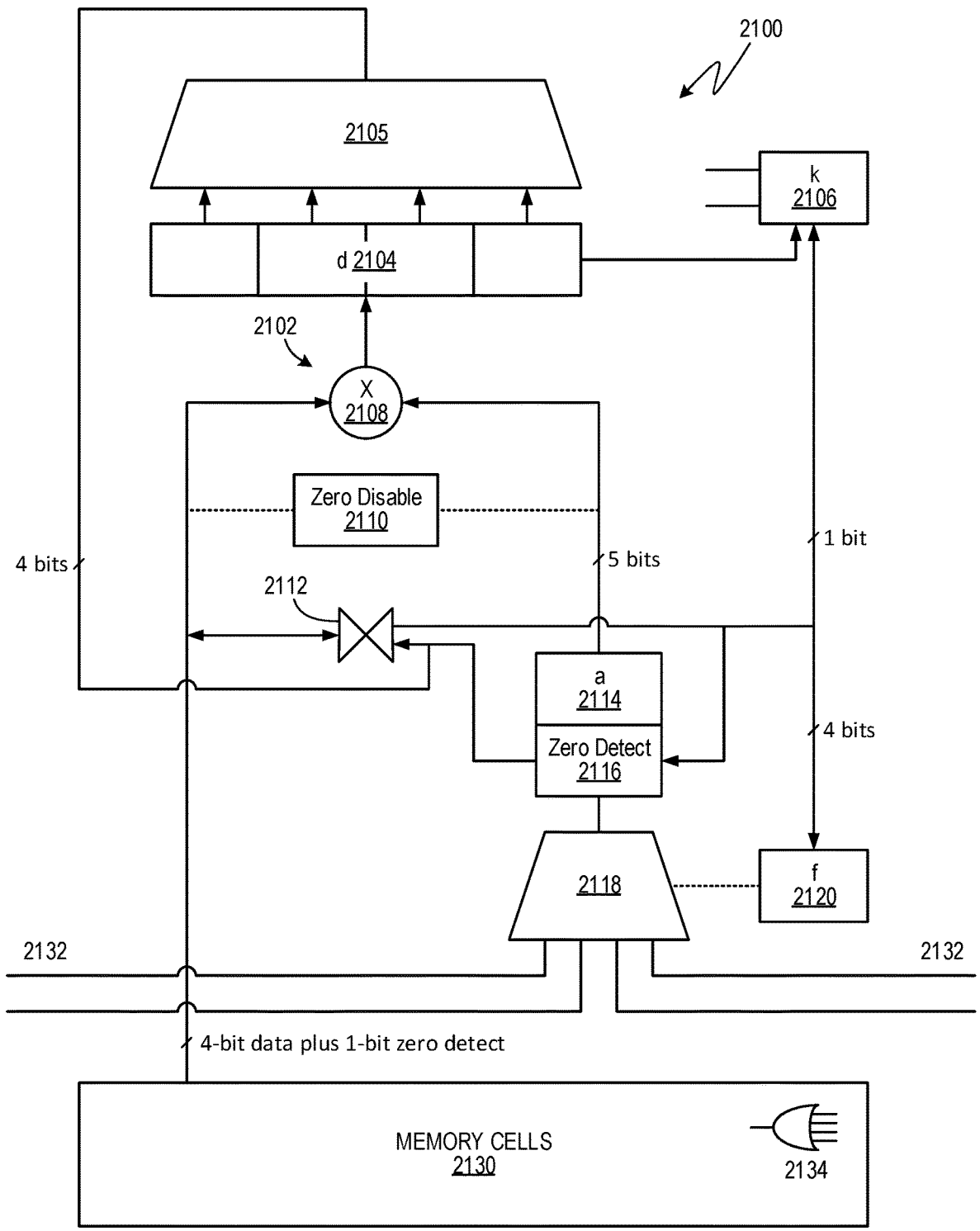
FIG. 21 is a block diagram of an example processing element with zero detection and disabling functionality.

FIG. 21 shows another example of a PE 2100 that may be used with any of the example banks of processing elements discussed herein.

The PE 2100 includes an ALU 2102, an array of resultant registers 2104, a resultant selector 2105, a hold register 2106, a zero disable 2110, a switch 2112, an input vector register 2114, an input zero detector 2116, neighbor PE interconnect control 2118, and a listen register 2120.

The ALU 2102 implements an operation on data in the input vector register 2114 and data in memory cells 2130 associated with the PE 2100. Examples of such operations include multiplying accumulation as discussed elsewhere herein. This may include, for example, multiplying matrix coefficients, which may be stored in memory cells 2130, by an activation vector, which may be stored in input vector register 2114. During such operation, the array of resultant registers 2104 may accumulate resultant vector components. The ALU 2102 may include one or more levels of multiplexor and/or a multiplier 2108.

Accumulation of results in resultant registers 2104 may be performed. That is, at a given time, the input vector register 2114 may be multiplied with selected coefficients from memory cells 2130 and the products may be accumulated at the resultant registers 2104 (e.g., a product is added to a value already in a resultant register). As such, for a particular value in the input vector register 2114, an appropriate value may be selected from memory cells 2130 for multiplication and an appropriate resultant register 2104 may perform the accumulation. This may implement any of the input vector cycling/shuffling described herein, such as discussed with respect to FIGS. 7A-7C.

The resultant selector 2105 selects a resultant register 2104 to write to the memory cells 2130.

The neighbor PE interconnect control 2118 may communicate values between the input vector register 2114 of the PE 2100 and an input vector register 2114 of a neighboring PE 2100. As such, the neighbor PE interconnect control 2118 is connected to a like element in neighboring PEs 2100 via interconnections 2132. For example, the neighbor PE interconnect control 2118 may be connected to first neighbor PEs 2100 on each side of the PE 2100, second neighbor PEs 2100 on each side of the PE 2100, fourth neighbor PEs 2100 on each side of the PE 2100, and/or sixth neighbor PEs 2100 on each side of the PE 2100. When no such neighbor PE exists in the bank to which the PE 2100 is provided, the neighbor PE interconnect control 2118 may be connected to respective PEs 2100 of a neighboring bank and/or to a controller. The neighbor PE interconnect control 2118 may be configured to rotate or shuffle input vector values as discussed elsewhere herein. The neighbor PE interconnect control 2118 may connect neighboring PEs 2100 in a row (left-right) of PEs 2100. Additionally or alternatively, a neighbor PE interconnect control 2118 may connect neighboring PEs 2100 in a column (up-down) of PEs 2100.

The neighbor PE interconnect control 2118 may include a logic/switch array to selectively communicate values among PEs 2100, such as the logic/switch arrays discussed elsewhere herein.

The neighbor PE interconnect control 2118 may designate a single neighbor PE 2100 from which to obtain data. That is, interconnections 2132 with neighbor PEs 2100 may be restricted so that a PE 2100 only at most listens to one selected neighbor PE 2100. The listen register 2120 controls from which, if any, PE 2100 that the neighbor PE interconnect control 2118 obtains data. That is, the listen register 2120 selects a neighbor PE 2100 as the source of input to the PE 2100.

The hold register 2106 may be set to disable computation by the ALU 2102. That is, data may be selected from memory 2130 and moved into/out of input vector register 2114 while the hold register 2106 at the same time ensures that the computation is not performed by the PE 2100, but may be performed by other PEs in the same row/column.

The zero disable 2110 controls the inputs to the multiplier 2108 to be unchanged when detecting that one or both intended inputs to the multiplier 2108 are zero. That is, should the intended inputs include a zero value for multiplication and accumulation, the zero disable 2110 holds the present input values as unchanged instead of providing the actual inputs that include the zero value. Multiplication by zero produces a zero product which does not need to be accumulated. As such, the zero disable 2110 saves energy, as the ALU 2102 uses significantly more energy when an input changes as opposed to when the inputs do not change.

The switch 2112 allows a selected resultant register 2104 or the input vector register 2114, via the input zero detector 2116, to be written to memory cells 2130. The switch 2112 allows data from the memory cells 2130 to be written to the listen register 2120. The switch 2112 allows one bit of data to be written to the hold register 2106. The switch 2112 allows data to be written to the input vector register 2114 through the input zero detector 2116. If switch 2112 is open, then the memory cells 2130 are connected to the multiplier 2108, without being loaded down by inputs of the input vector register 2114 and input zero detector 2116 or the resultant selector 2105.

The input zero detector 2116 detects whether the input vector register 2114 contains a value that is zero. Likewise, the memory cells 2130 may include OR logic 2134 to determine whether the selected value in the memory cells 2130 is zero. The OR logic 2134 provides an indication of a zero value. As such, when either (or both) of the input vector register 2114 and the selected value in the memory cells 2130 is zero, the zero disable 2110 controls both inputs from the input vector register 2114 and the selected value in the memory cells 2130 to appear to the ALU 2102 to be unchanged, thereby refraining from performing a needless multiplication and accumulation and saving power at the ALU 2102.

Figure 22:
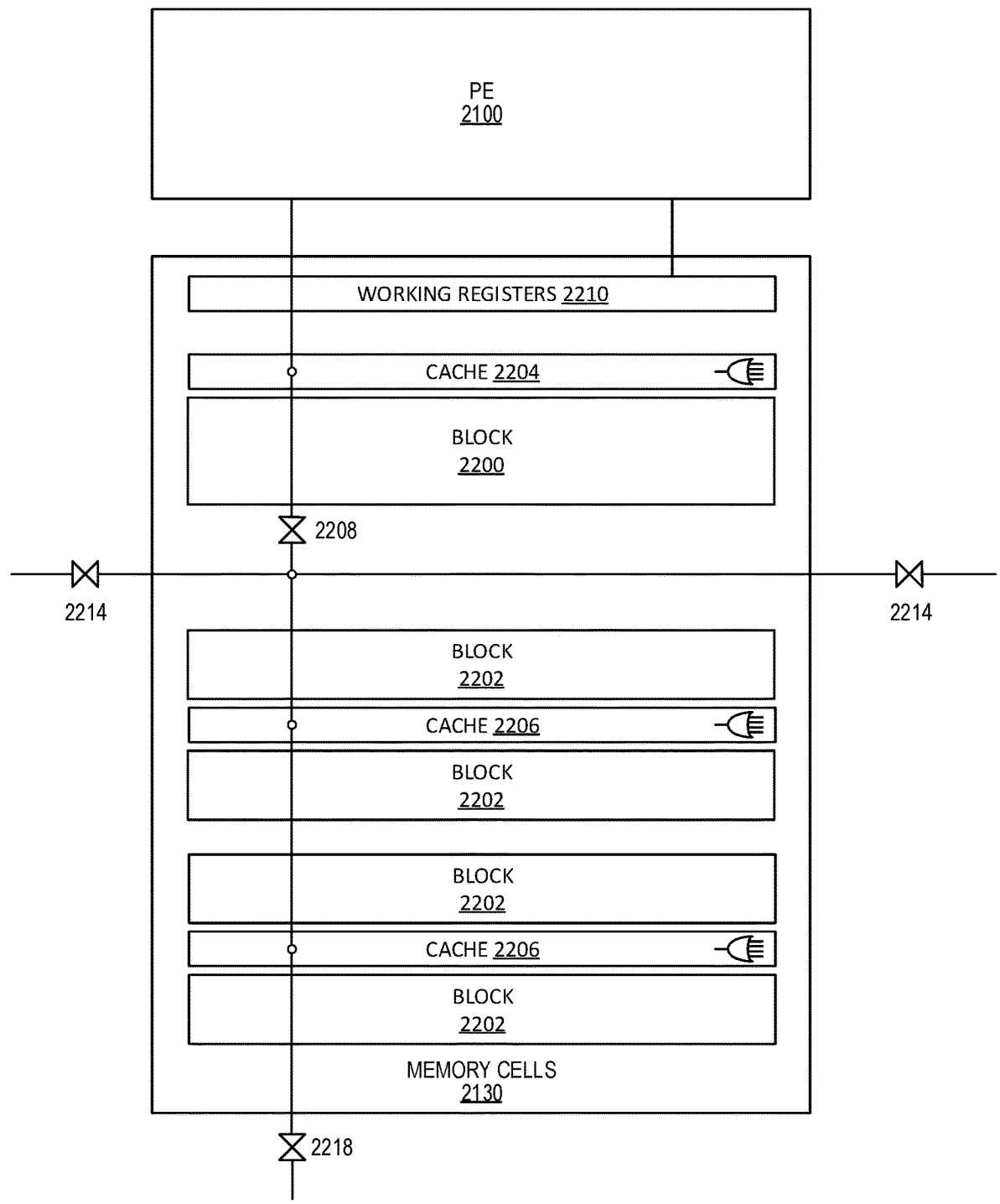
FIG. 22 is a block diagram of memory cells associated with a processing element, where the memory cells are configured in blocks and related caches.

With reference to FIG. 22, the memory cells 2130 associated with a PE 2100 may include blocks 2200, 2202 of memory cells and related caches 2204, 2206. In this example, a main memory block 2200 is associated with a cache 2204 and secondary memory blocks 2202 are each associated with a cache 2206. The caches 2204, 2206 communicate with the PE 2100 rather than the PE communicating with the memory blocks 2200, 2202 directly.

A cache 2204, 2206 may read/write to its memory block 2200, 2202 an amount of data that is larger than the amount communicated with the PE 2100. For example, a cache 2204, 2206 may read/write to its memory block 2200, 2202 in 16-bit units and may communicate with the PE 2100 in 4-bit units. As such, timing of read/write operations at the memory blocks 2200, 2202 may be relaxed. Thus, it is contemplated that the processing speed of the PE 2100 will govern operations of the PE 2100 with the memory cells 2130. Clocking of the memory cells 2130 can be increased to meet the needs of the PE 2100.

An isolation switch 2208 may be provided to isolate secondary memory blocks 2202 and their caches 2206 from the PE 2100. As such, the PE 2100 may be selectably connected to a smaller set of memory cells or a larger set of memory cells. When the isolation switch 2208 is closed, the PE 2100 may access the main memory block 2200 and the secondary memory blocks 2202, through the caches 2204, 2206, as a contiguous range of addresses. When the isolation switch 2208 is opened, the PE 2100 may only access the main memory block 2200, though its cache 2204, with the respective reduced range of addresses. Opening the isolation switch 2208 to reduce the amount of available memory to the PE 2100 may save energy. The isolation switch 2208 may be implemented by a switchable bus that connects the secondary caches 2206 to the PE 2100.

In this example, each cache 2204, 2206 includes OR logic to inform the PE 2100 as to whether the memory value selected by the PE 2100 is zero. As such, the above-discussed technique of refraining from changing ALU input values may be used to save power.

Further, in this example, the memory cells 2130 include working or scratch registers 2210 connected to the PE 2100 to provide temporary space for intermediate or larger-bit computations.

A memory-sharing switch 2214, 2218 may be provided to connect memory blocks 2200, 2202 of a PE 2100 to memory blocks 2200, 2202 of a neighboring PE 2100. The memory-sharing switch 2214, 2218 may be implemented as a switchable bus that connects the caches 2204, 2206 to respective caches 2204, 2206 of a set of memory cells 2130 associated with a neighboring PE 2100.

Figure 23:
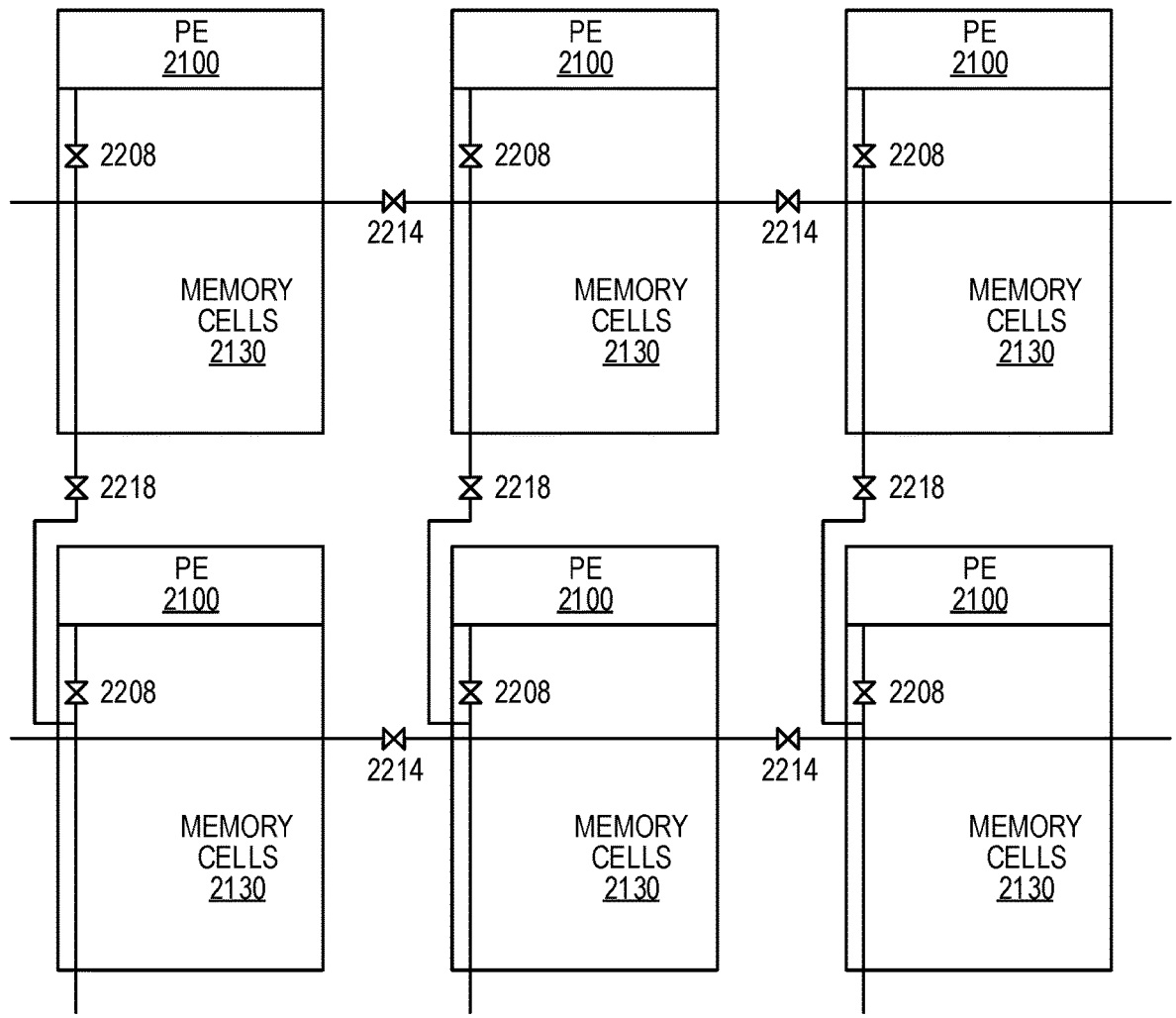
FIG. 23 is a block diagram of an arrangement of memory cells and associated processing elements of FIG. 22 connected by memory-sharing switches.

As shown in FIG. 23, a left-right (row-based) memory-sharing switch 2214 may connect PE memory 2130 to a left/right neighbor PE memory 2130. Similarly, an up-down (column-based) memory-sharing switch 2218 may connect PE memory 2130 to an up/down neighbor PE memory 2130. Any number and combination of such memory-sharing switches 2214, 2218 may be provided to combine memory cells 2130 associated with individual PEs 2100 into a combined pool of memory cells 2130 associated with a group of PEs 2100.

Memory-sharing switches 2214, 2218 may be provided between groups of memory cells 2130 so that a maximum pool of memory cells 2130 is determined by hardware. Alternatively, memory-sharing switches 2214, 2218 may be provided between all memory cells 2130, and firmware or software may govern a maximum pool size, if any.

PEs 2100 can share memory in groups of two or four, in this example. If a PE fails, it can be skipped. An entire column of PEs can be labelled as bad if a particular PE in the column is bad, so as to avoid having to move data laterally around the bad PE. In FIG. 23, for example, if the top center PE 2100 had failed, it and both the top and bottom center PEs can be labeled "bad" and be skipped. However, if the rightmost PEs were supposed to be grouped with the center PEs to share memory, this memory can no longer be shared due to the bad PEs. The rightmost PEs can also skip the bad column of PEs and share with the leftmost PEs. This can be achieved by each PE having a DUD register that can be written from SRAM. An application can then initially detect the bad or failed PEs, and set the DUD bits for the entire column of PEs of the broken PE. When SRAM is then to be shared in a group that contains a DUD column, the controller can read the DUD bit and skip over the PE in that column. Hence, if the center column of PEs had their DUD bit set, the rightmost PEs could still share SRAM with the leftmost PEs.

In other examples, if size and power restrictions are a concern, a maximum size of shared PEs may be enforced such as a two-by-two arrangement of four PEs. Groups of four PEs may have hardwired interconnections. In this example, the DUD bit disables an entire block of four PEs.

In still other examples, the hardware may be further simplified and memory sharing may not be omitted. The DUD bit may provide a way of turning off a PE to save power.

With reference back to FIG. 22, caches 2204, 2206 may provide I/O capabilities, such as addressing and address mapping for a pool of memory cells 2130 as enabled by memory-sharing switches 2214, 2218. Further, caches 2204, 2206 may be configured to perform copy, move, or other operations as facilitated by memory-sharing switches 2214, 2218. That is, caches 2204, 2206 may be I/O enabled so as to communicate information with the respective PE 2100 and further to communicate information with any other caches 2204, 2206 connected by memory-sharing switches 2214, 2218. As such, data in memory cells 2130 may be copied, moved, or undergo other operation independent of operation of a PE 2100.

Further, the isolation switch 2208 may allow a PE 2100 to access its main memory block 2200 while memory-to-memory operations, enabled by secondary caches 2206 and memory-sharing switches 2214, 2218, are performed to share information in secondary memory blocks 2202 with neighboring memory. This may allow for greater operational flexibility and for reading/writing data to memory 2130 while allowing PEs 2100 to continue with their assigned computations.

Figure 24:
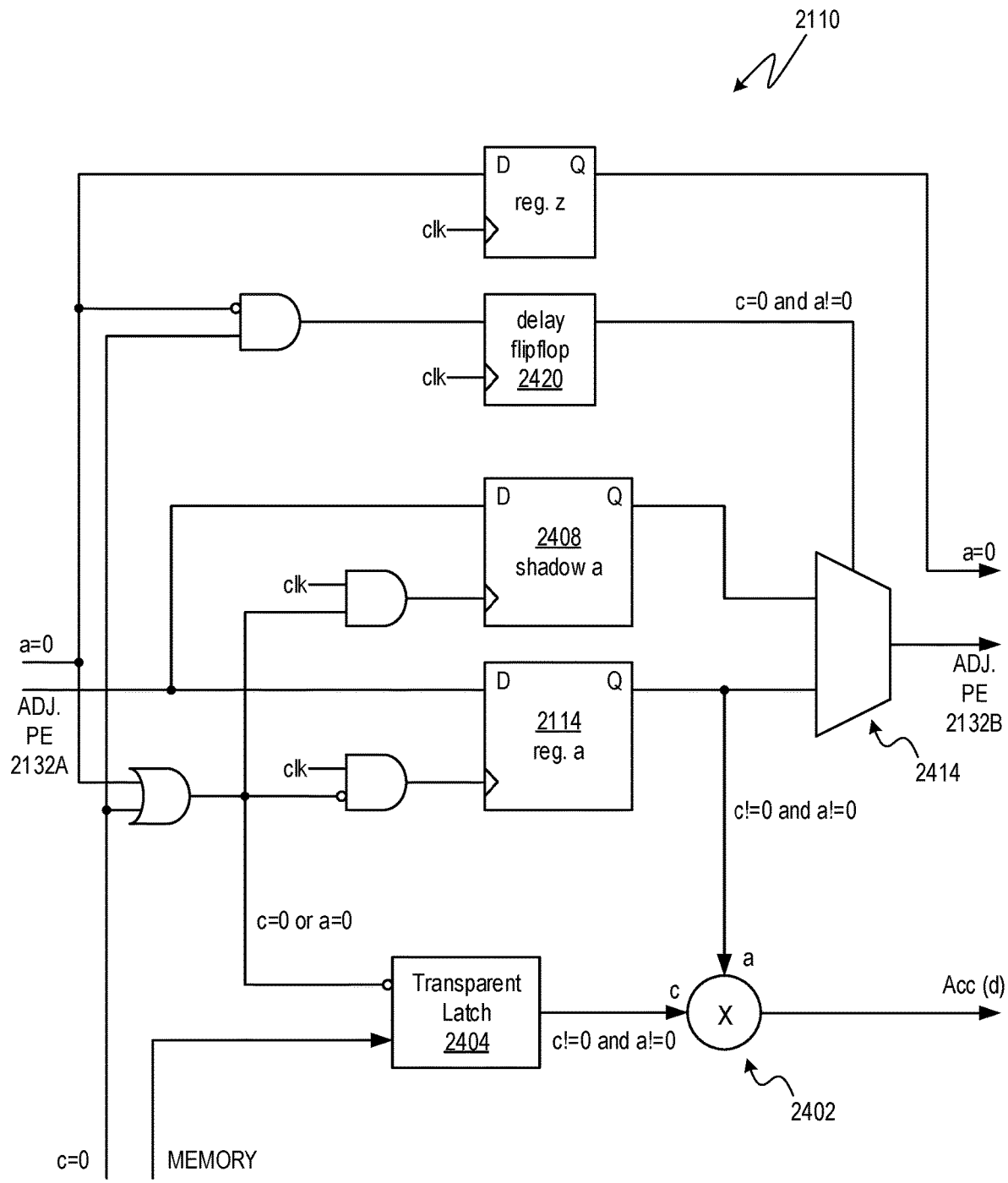
FIG. 24 is a block diagram of an example zero disable circuit.

FIG. 24 shows a zero disable circuit 2110 that may be used in PEs discussed elsewhere herein, such as the PE 2100 of FIG. 21. The zero disable circuit 2110 reduces power consumption used by a multiplier and/or accumulator of the PE. Such power may be saved by disabling the multiplier and/or the accumulator when an input value "a" of an adjacent PE is zero and/or when a coefficient "c" at the present PE is zero. Power savings may be substantial when the PEs are part of a device that processes a neural network, as it is often the case that a significant number (e.g., 50%) of values in such processing are zeros. Further, neural network can be trained to have coefficients "c" that tend to be zero, such that specific training can enhance power savings.

In addition to input values "a" taken from an adjacent PE at 2132A and coefficients "c" taken from memory, the zero disable circuit 2110 also takes respective indicators of whether or not such values "a" and "c" are zero, as indicated by "a=0" and "c=0", respectively.

Various components of the zero disable circuit 2110 operate according to a clock ("clk").

The zero disable circuit 2110 includes a multiplier 2402 to multiply input value "a" and coefficient "c". The multiplier 2402 includes cascading logic, operates asynchronously, and therefore does not operate according to the clock. The multiplier 2402 is triggered only if either or both of its inputs, i.e., the input value "a" and the coefficient "c", change. Hence, if either or both of the inputs "a" and "c" is zero, then the inputs to the multiplier 2402 are held unchanged, so as to prevent the multiplier 2402 from computing a zero result that unnecessarily consumes power.

The zero disable circuit 2110 includes a transparent latch 2404. Input to the transparent latch 2404 includes coefficients "c" from memory associated with the PE (e.g., memory cells 2130 of FIG. 21). The transparent latch 2404 acts as a pass-through when its select line stays high, requiring minimal power. When the select line of the transparent latch 2404 is lowered, it latches the current value into a fixed state. This uses power, but occurs less frequently than a latch that is set at each clock cycle. The transparent latch 2404 is set if coefficient "c" or input value "a" is zero, and the multiplier 2402 consequently does not receive a change in the coefficient "c" value. Rather, the multiplier 2402 still receives the previous value of the coefficient "c".

The input value "a" is handled similarly. The zero disable circuit 2110 includes a register 2114 to store an input value "a", as may be received with data from an adjacent PE at 2132A. The zero disable circuit 2110 receives a value for "a" from an adjacent PE and does not latch this value of "a" if either "a" or "c" is zero. If the coefficient "c" is zero and the input value "a" is not zero (a!=0), then the input value "a" is stored, as the input value "a" may still need to be passed to the next adjacent PE at 2132B. The zero disable circuit 2110 includes a shadow register 2408 to transfer the input value "a" to the next PE at 2132B. The shadow register 2408 has a path parallel to the main register 2114 that stores the input value "a". The shadow register 2408 is used to latch in the input value "a" if either "a" or "c" is zero.

The zero disable circuit 2110 further includes a demultiplexer 2414 at the outputs of the main register 2114 and shadow register 2408 to select which value to pass to the next PE at 2132B.

The shadow register 2408 is useful when the input value "a" is not zero (a!=0) and the coefficient "c" is zero. However, in this example, signal timing is simplified by also using the shadow register 2408 for the case where the input value "a" is zero and the coefficient "c" is zero.

When neither the input value "a" nor the coefficient "c" is zero, then the coefficient "c" flows from memory, through the transparent latch 2404, and to the multiplier 2402. Further, the input value "a" flows from the previous adjacent PE at 2132A through the main registers 2114, to the multiplier 2402, and also to the next adjacent PE at 2132B.

When either "a" or "c" are zero, the previous coefficient "c" from memory is held in the transparent latch 2404, and the previous input value "a" is held in the main register 2114. As such, the inputs to the multiplier 2402 do not change, and the multiplier 2402 is therefore not triggered, saving power.

The "a=0" signal from the previous adjacent PE at 2132A is held for one clock cycle, and then passed on to the next adjacent PE at 2132B.

When the input value "a" is not zero and the coefficient "c" is zero, then the contents of the shadow register 2408 is selected to be passed on to the next PE at 2132B. It is selected by a signal, delayed by one clock cycle, by a delay flipflop 2420, which holds the signal for the duration of one clock.

Further, in this example if the input value "a" is zero and the coefficient "c" is also zero, the input value "a" value of zero is latched to the shadow register 2408, although it is never used. This simplifies signal timing issues and may further save power. Such a zero value is not passed on to the next PE at 2132B, since the demultiplexer signal that selects between the main register 2114 and the shadow register 2408 is only triggered for the case where "c=0 and a!=0". However, the "a=0" signal is passed on. This may save some power, since the previous value of the main register 2114 is passed on to the next PE at 2132B (along with the "a=0" signal that tells the next PE to ignore the actual input value "a"), and since the value has not changed, the signals in the conductors connecting the PEs do not have to change, which would otherwise cost power.

There are various examples where refraining from triggering an ALU can reduce computations and save power. In neural networks, layers of convolutions are often used. After each convolution, a scale factor (e.g., multiplying all the results by a common factor) is often applied to normalize data or to shift the data into a useable range. When using integer math, the scale factor may be performed as two steps: multiplication by a factor, and then a bit-shift. A bit-shift shifts the bits of a result rightwards, discarding the lower least significant bits.

Multiplication and shift values are often known in advance, as with the coefficients. If the multiplier value and shift value are such that some or many of the lower bits will be discarded, this means that some of the least significant terms are never used. Hence, two approaches may be used to save power: (1) a part of the output may be skipped (e.g., the lowest "little 'a'×little 'c'" term) and/or (2) refrain from calculating the lowest term (e.g., "little 'a'×little 'c'") of the convolution at all. The first may save some cycles. The second may save many cycles. In an example that uses 4-bit PEs to perform 8-bit computations, up to ¼ of the convolution computation may be saved.

With regard to all examples herein, a power-saving floating point representation may be used. Power may be saved when input values "a" and/or coefficients "c" are zero. Such values "a" and "c" may be represented by 4-bit nibbles. For 8-bit (Aa) by 8-bit (Cc) multiplications, multiplications may be performed in four stages, A*C, A*c, a*C, a*c. It is contemplated that Aa and Cc are distributed in some kind of distribution (such as a Gaussian distribution), where values near zero are most common, and the values farther away from zero are less common. Accordingly, values may be quantized, such that if a value is greater or equal to +/−16, it is rounded to the nearest multiple of 16. In this way, a lower nibble for such numbers will always be zero and power will be saved when processing this nibble. In this way, all small values, less than 16, will have their MSNs=0. All large values, greater or equal to 16 will have their LSNs=0. When multiplication is performed on the basis of nibbles, this kind of rounding can be used to force a significant number of nibbles to zero, thereby saving power at the cost of some accuracy. If rounding on the basis of +/−16 causes too much loss in accuracy, then quantization at +/−32 or other value may be used.

As should be apparent from the above discussion, the techniques discussed herein are suitable for low-power neural-network computations and applications. Further, the techniques are capable of handling a large number of computations with flexibility and configurability.

It should be recognized that features and aspects of the various examples provided above can be combined into further examples that also fall within the scope of the present disclosure. In addition, the figures are not to scale and may have size and shape exaggerated for illustrative purposes.

The invention claimed is:

1. A controller of an array of processing elements, the controller configured to:
   add a row of error-checking values to a matrix of coefficients, each error-checking value of the row of error-checking values being a negative sum of a respective column of the matrix of coefficients;
   load the matrix of coefficients into the array of processing elements as serialized coefficients;
   load an input vector into the array of processing elements; and
   control the array of processing elements to perform an operation with the matrix of coefficients and the input vector by:
      performing a parallel operation with the serialized coefficients in the array of processing elements and the input vector;
      accumulating a result vector; and
      rotating the input vector in the array of processing elements and repeating the performing of the parallel operation and the accumulating until the operation is complete;
   wherein when the operation is complete, a sum of elements of the result vector is computed and an error in the operation is detected when the sum is non-zero.

2. The controller of claim 1, wherein the controller is configured to repeat the operation using a different array of processing elements when the error is detected.

3. The controller of claim 1, wherein the sum of elements of the result vector is computed over a finite field.

4. The controller of claim 3, wherein the finite field is integers modulo a power of 2.

\* \* \* \* \*